(12) United States Patent
Pan et al.

(10) Patent No.: US 9,200,156 B2
(45) Date of Patent: Dec. 1, 2015

(54) POLYMER BLENDS AND THEIR USE IN ORGANIC LIGHT EMITTING DEVICES

(75) Inventors: Junyou Pan, Frankfurt (DE); Frank Meyer, Hamshire (GB)

(73) Assignee: Merck Patent GmbH (DE)

( * ) Notice: Subject to any disclaimer, the term of this patent is extended or adjusted under 35 U.S.C. 154(b) by 1509 days.

(21) Appl. No.: 12/374,959

(22) PCT Filed: Jun. 28, 2007

(86) PCT No.: PCT/EP2007/005722
§ 371 (c)(1),
(2), (4) Date: Jan. 23, 2009

(87) PCT Pub. No.: WO2008/011953
PCT Pub. Date: Jan. 31, 2008

(65) Prior Publication Data
US 2009/0184635 A1     Jul. 23, 2009

(30) Foreign Application Priority Data

Jul. 25, 2006 (EP) .................................... 06015459

(51) Int. Cl.
| | |
|---|---|
| *H01L 51/00* | (2006.01) |
| *C08L 65/00* | (2006.01) |
| *C08G 61/02* | (2006.01) |
| *C08G 61/10* | (2006.01) |
| *C08G 61/12* | (2006.01) |
| *C09B 57/00* | (2006.01) |
| *C09B 57/10* | (2006.01) |
| *H01L 51/50* | (2006.01) |

(52) U.S. Cl.
CPC ................ *C08L 65/00* (2013.01); *C08G 61/02* (2013.01); *C08G 61/10* (2013.01); *C08G 61/12* (2013.01); *C08G 61/126* (2013.01); *C09B 57/008* (2013.01); *H01L 51/0036* (2013.01); *H01L 51/0039* (2013.01); *H01L 51/0043* (2013.01); *C08G 2261/314* (2013.01); *C08G 2261/3142* (2013.01); *C08G 2261/3162* (2013.01); *C08G 2261/5222* (2013.01); *C08L 2205/02* (2013.01); *C09B 57/10* (2013.01); *H01L 51/5012* (2013.01); *Y02E 10/549* (2013.01); *Y10T 428/31786* (2015.04)

(58) Field of Classification Search
USPC .................................................. 257/E51.036
See application file for complete search history.

(56) References Cited

U.S. PATENT DOCUMENTS

| | | |
|---|---|---|
| 6,124,046 A | 9/2000 | Jin et al. |
| 6,362,310 B1 | 3/2002 | Woo et al. |
| 6,861,502 B1 | 3/2005 | Towns et al. |
| 6,897,473 B1 | 5/2005 | Burroughes et al. |
| 6,960,637 B2 | 11/2005 | Schwalm et al. |
| 2001/0026878 A1 | 10/2001 | Woo et al. |
| 2003/0045642 A1 | 3/2003 | Wu et al. |
| 2003/0181617 A1 | 9/2003 | Schwalm et al. |
| 2004/0013904 A1 | 1/2004 | Cina |
| 2005/0019607 A1 | 1/2005 | So et al. |
| 2005/0145537 A1 | 7/2005 | Wellington et al. |
| 2005/0159582 A1 | 7/2005 | Schwalm et al. |
| 2008/0213623 A1 | 9/2008 | Dotz et al. |

FOREIGN PATENT DOCUMENTS

| | | |
|---|---|---|
| EP | 1344788 A1 | 9/2003 |
| EP | 1345477 A2 | 9/2003 |
| GB | 2440482 A | 1/2008 |
| GB | 2445519 A | 7/2008 |
| JP | 2003-171524 A | 6/2003 |
| WO | WO-99/48160 | 9/1999 |
| WO | WO-00/55927 | 9/2000 |
| WO | WO-02/28983 A1 | 4/2002 |
| WO | WO-2004/084260 A2 | 9/2004 |
| WO | WO-2005/053052 A1 | 6/2005 |
| WO | WO-2006/114364 A1 | 11/2006 |
| WO | WO-2006/118345 A1 | 11/2006 |
| WO | WO-2007/043495 A1 | 4/2007 |

*Primary Examiner* — Marie R. Yamnitzky
(74) *Attorney, Agent, or Firm* — Drinker Biddle & Reath LLP

(57) ABSTRACT

The invention relates to novel polymer blends comprising one or more hole transporting polymers and one or more electron transporting polymers, to the use of these blends in electronic and electrooptical devices, in particular in organic light emitting diodes (OLEDs), and to OLEDs comprising the polymer blends.

23 Claims, 5 Drawing Sheets

POLYMER BLENDS AND THEIR USE IN ORGANIC LIGHT EMITTING DEVICES

RELATED APPLICATIONS

This application is a national stage application (under 35 U.S.C. §371) of PCT/EP2007/005722, filed Jun. 28, 2007, which claims benefit of European Application No. 06015459.8, filed Jul. 25, 2006.

FIELD OF THE INVENTION

The invention relates to novel polymer blends comprising one or more hole transporting polymers and one or more electron transporting polymers. The invention further relates to the use of these blends in electronic and electrooptical devices, in particular in organic light emitting diodes (OLEDs). The invention further relates to OLEDs comprising the polymer blends.

BACKGROUND AND PRIOR ART

OLEDs based on organic polymer materials, also known as polymer light emitting diodes (PLEDs), have drawn much attention due to their potential application in next generation panel displays. Though huge improvement has been achieved in the last years, the performance of the PLEDs, especially the lifetime (particularly for blue PLEDs) still needs further improvement to be commercially successful. Single layer PLEDs, where the hole transport, electron transport and emissive layer are combined into one layer, have the advantage of simple processing, however, they do often show poor lifetime. WO 2004/084260 A2 discloses a PLED wherein the combination of a specific cathode metal with an interlayer between the hole injection layer (HIL) and the light emitting polymer (LEP) is reported to improve the lifetime compared to a conventional single layer PLED.

An "interlayer" as referred to hereinafter means a layer in an OLED device that is situated either between the hole injection layer (HIL) and the emissive layer (EL), or between the electron injection layer (EIL) and the EL, and is intended to prevent electrons from flowing into the HIL, or holes from flowing into the EIL, respectively. An interlayer for use between the HIL and the EL should usually comprise a material having hole transport and electron blocking property, and an interlayer for use between the EIL and the EL should comprise a material having electron transport and hole blocking property.

However, the additional interlayer is undesired in mass production. Also, since its processing is not easy and well controllable, the reliability of the performance of a PLED comprising such an interlayer is usually not sufficient for mass production.

It is therefore one aim of the present invention to find single layer PLEDs having a lifetime of the interlayer system that is comparable or even better than that of prior art PLEDs. Another aim of the present invention is to provide new materials for use in single layer PLEDs, which have advantageous properties, in particular good processability and high lifetime. Another aim the present invention is to extend the pool of PLED materials available to the expert. Other aims of the present invention are immediately evident to the expert from the following detailed description.

It has been found that these aims can be achieved by providing polymer blends as claimed in the present invention. In particular, it was surprisingly found that by using a blend of a hole conducting polymer (hereinafter also referred to as "polymer 1") and an electron conducting polymer (hereinafter also referred to as "polymer 2") as LEP in a single layer PLED device, it is possible to achieve a longer lifetime than in a PLED where polymer 1 has the function of an interlayer and polymer 2 has the function of an emissive layer.

WO 2005/053052 A1 discloses a polymer blend comprising a first and a second polymer with triarylamine units, wherein both polymers have hole transport properties. In contrast, the polymer blends according to the present invention are characterized in that the two polymers do transport different types of charge carriers, and preferably either polymer transports only one type of charge carrier.

Morteani et al., Adv. Mater. 2003, 15(20), 1708 and WO 02/28983 A1 disclose a polymer blend comprising a polymer with fluorene units and benzothiadiazole units and a polymer with fluorene units and triarylamine units, and its use in PLEDs. However, the polymers described in these references are suggested to have a bandgap offset smaller than the exciton binding energy, so that the exciton can be stabilised at the blend interface, thus realising a barrier-free heterojunction, and thus a high efficient green PLED using these blends. In contrast, a blend consisting of polymers having a large bandgap offset is usually considered to be advantageous only for use in photovoltaic cells, but disadvantageous for use in PLEDs. This is reported for example by J. J. M. Halls et al., Phys. Rev. B. 1999, 60, pp 5721. Also, WO 02/28983 A1 discloses only a narrow, defined range for the molecular weight of the polymers to be used in the blend.

Birgerson et al., Adv. Mater. 1996, Vol 8, pp 982, "Efficient blue-light emitting devices from conjugated polymer blends", discloses a device wherein the emissive layer consists of a blend of PDHPT (poly(2,5-diheptyl-1,4-phenylene-alt-2,5-thienylene)) and PDPP (poly(2,5-diheptyl-2',5'-dipentoxybiphenylene)). U.S. Pat. No. 5,378,519 discloses a PLED containing a compound having a skeleton of triarylamin and having a carbonyl group. The compound can be blended with other polymers as emissive layer. Cimrova et al., in Adv. Mater. 1998, Vol 10, pp 676, "blue light emitting devices based on novel polymer blends" disclose a device wherein the emitting layer consists of PPBSi (poly(phenyl-biphenylylsilylene)), P3V (poly(p-terphenyldiyl-vinylene)) and PBD (2-(4-biphenylyl)-5-(4-tert-butylphenyl)-1,3,4-oxadiazole)). The two polymers have similar HOMO levels. Berggren et al, Nature 1994, Vol. 372, pp 444, discloses PLEDs comprising a polymer blend, wherein the color is varying as a function of the operation voltage. The polymers used in this device are four different thiophene homopolymers.

Cina et al., Proceedings of SPIE Vol. 4279 pp 221, discloses a PLED based on a blend of two polyfluorenes prepared by Suzuki cross-coupling, with the first component being an electron transporter and emitter and the second component being a hole transporter. No information on the polymer composition is given. However, it is indicated in the document that emitter and electron transport unit are given by the same unit in the first component. Morgado, et al., describe in Appl. Phys. Lett. 2002, Vol 80, pp 2436 a PLED using a blend of homo polymer poly(9,9'-dioctyl-fluorene) (PFO) with an alternating polymer poly(9,9'-dioctylfluorene-alt-benzothiadiazole) (F8BT) as emissive layer, and PPV prepared via standard precursor route as interlayer. The same blend is discussed by Wilkinson et al., in Appl. Phys. Lett. 2001, Vol 79 pp 171 for the dependence of performance on pixel dimension. Niu et al., describe a red PLED consisting of a blend of MEHPPV with terpolymers of dioctyl-fluorene (F8), benzothiadiazole (BT) and dithienylbenzothiadiazole (DBT). The MEHPPV is used as the hole transporting component, polymer backbone of the terpolymers as electron transport unit, and BT and DBT as emitter unit. Here all the HOMOs of electron transporting and emitter units are lower than the hole transporting unit MEHPPV. Suh, et al. report in Adv. Mater. 2003, Vol 15 pp 1254, that a blue bispirofluorene polymer can be enhanced by blending it with hole transporting small molecules (HTSM), such as 1,3,5-tris(N,N-bis(4-methoxyphenyl)aminophenyl)benzene (TDAPB), 4,4',4"-tris(N-3-methyl-phenyl-N-phenylamino)tri-phenylamine (MTDATA), N,N'-di(4-(N,N'-diphenyl-amino)phenyl)-N, N'-diphenylbenzidine (DNTPD) and 1,1-bis(4-bis(4-methylphenyl)amino-phenyl)cyclohexane (TAPC). Here, all of the HTMs have HOMOs similar to the blue polymer. Yong Cao et al., study in Science 1999, Vol. 397 pp 414 the singlet/triplet ratio in a conjugated polymer attained by blending electron transport materials with conjugated polymers, OC1C10-PPV and MEHPPV.

In WO 99/48160 A1, an OLED using a mixture of a hole transporting component (first component), an electron transporting component (second component) and an emissive component (third component) is disclosed, wherein at least one of the first, second and third components forms a type II semiconductor interface, with another of the first, second and third component. The type II interface is defined as an interface in which the minimum energy difference between the highest HOMO and the lowest LUMO state is between levels on different sides of the heterojunction. It is also disclosed that the third component and one of first and second component can be provided as functional moieties, say as pendant group, of the same molecule, say copolymer. However, no further enabling technical disclosure is provided in this direction. In fact, no such blend system with long lifetime has been reported so far.

It was now surprisingly found that by using a blend of two polymers with a large HOMO level offset as claimed in the present invention, a PLED device with improved performance could be achieved, in particular a single layer PLED with comparable or even better lifetime than interlayer PLEDs, thus leading to simple processing and higher reliability in mass production. Also, it was surprisingly found that in the blends according to the present invention even polymers with high molecular weight can be used, which could not be expected in view of the prior art.

The polymer blends of the present invention can be advantageously used both in PLEDs with and without an interlayer. On the one hand, if the polymer blends according to the present invention are used in a PLED device, it is possible to increase the lifetime of the device without the need of an interlayer, so that the interlayer can be omitted and the device assembly can be simplified. On the other hand, if the polymer blends according to the present invention are used in a PLED device comprising an interlayer, they do still significantly improve the performance of said device.

BRIEF DESCRIPTION OF THE DRAWINGS

FIG. 2 depicts a CV curve for polymer2a.
FIG. 5 depicts the lifetime curves of the PLEDs using blends of polymer 1 and polymer 2a.

SUMMARY OF THE INVENTION

Figure 1:
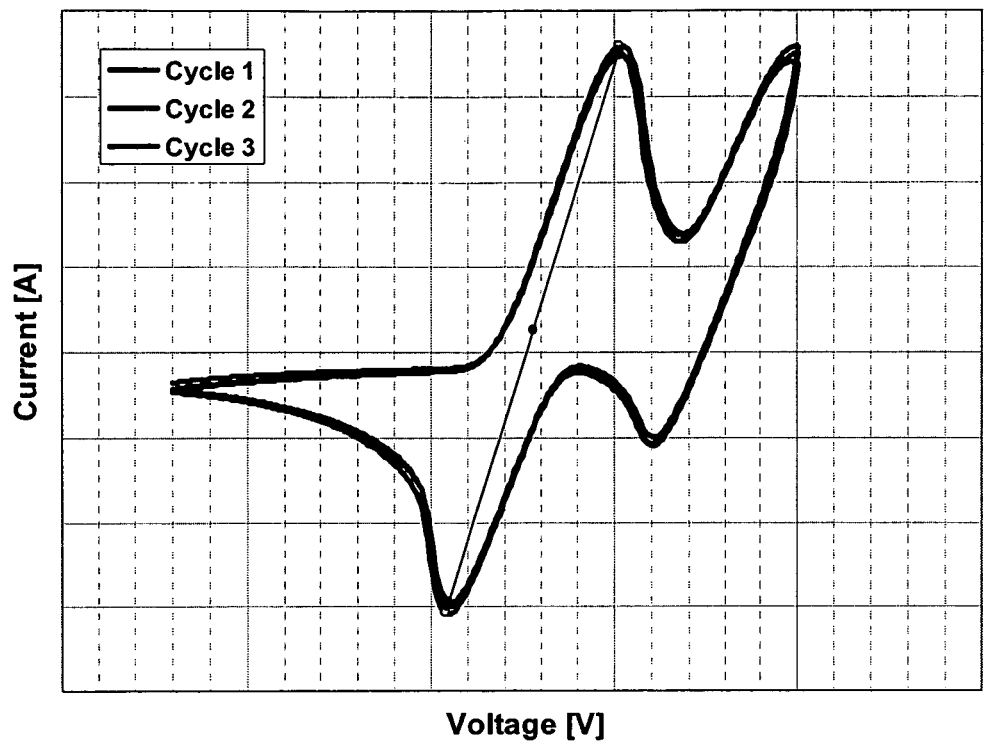
FIG. 1 depicts a CV curve for polymer 1.
Figure 2:
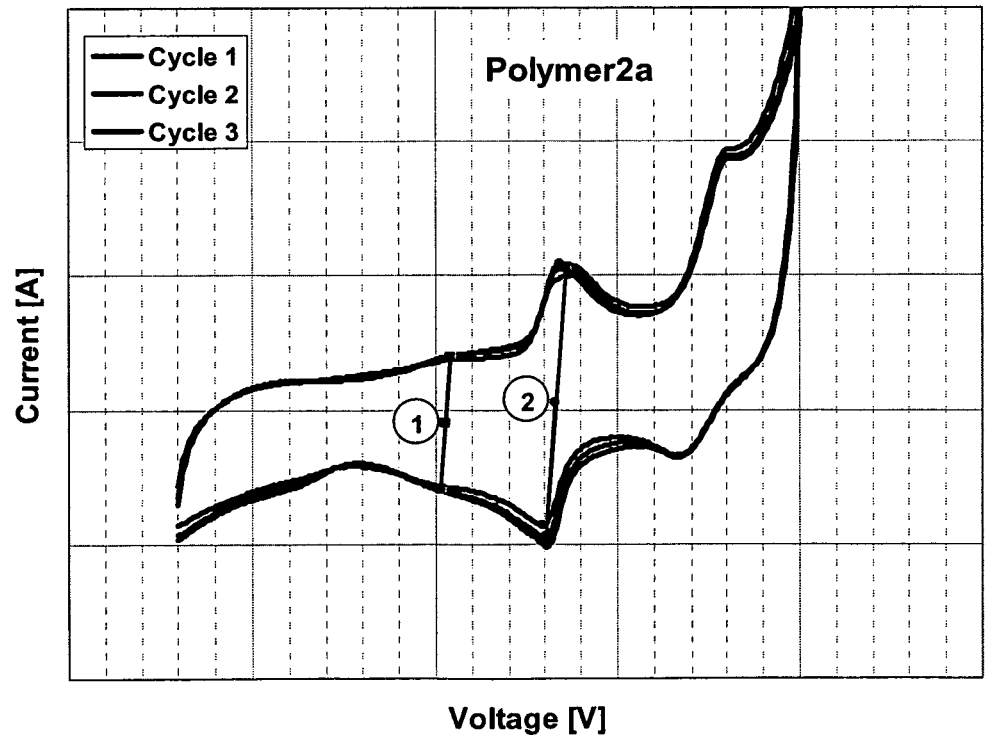
Figure 3:
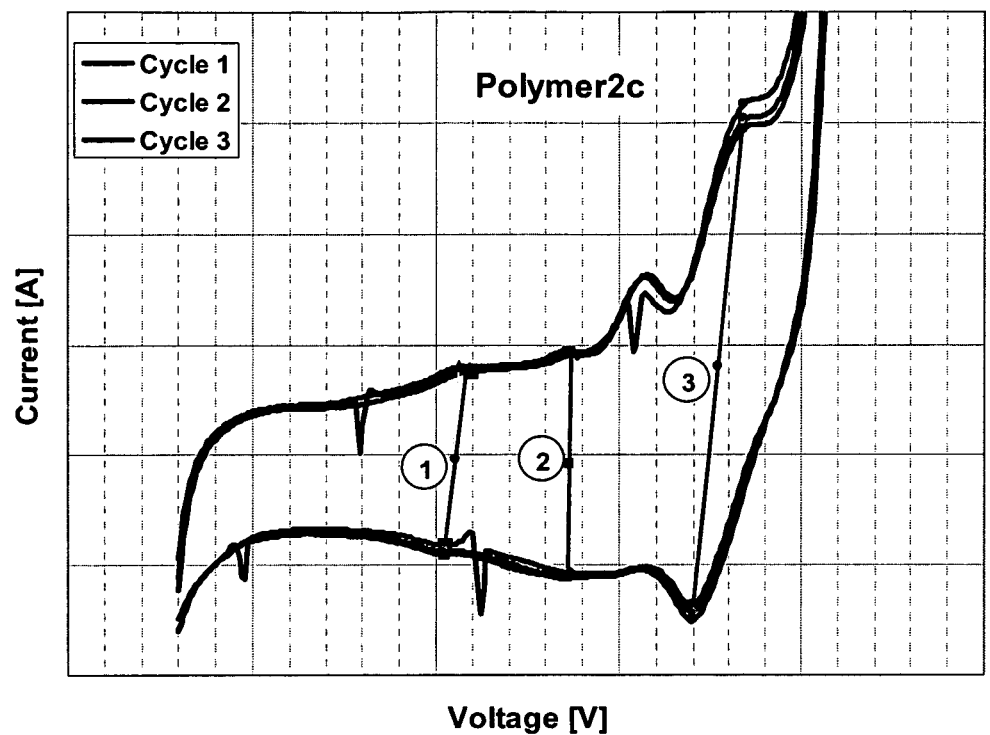
FIG. 3 depicts a CV curve for polymer 2c.
Figure 4:
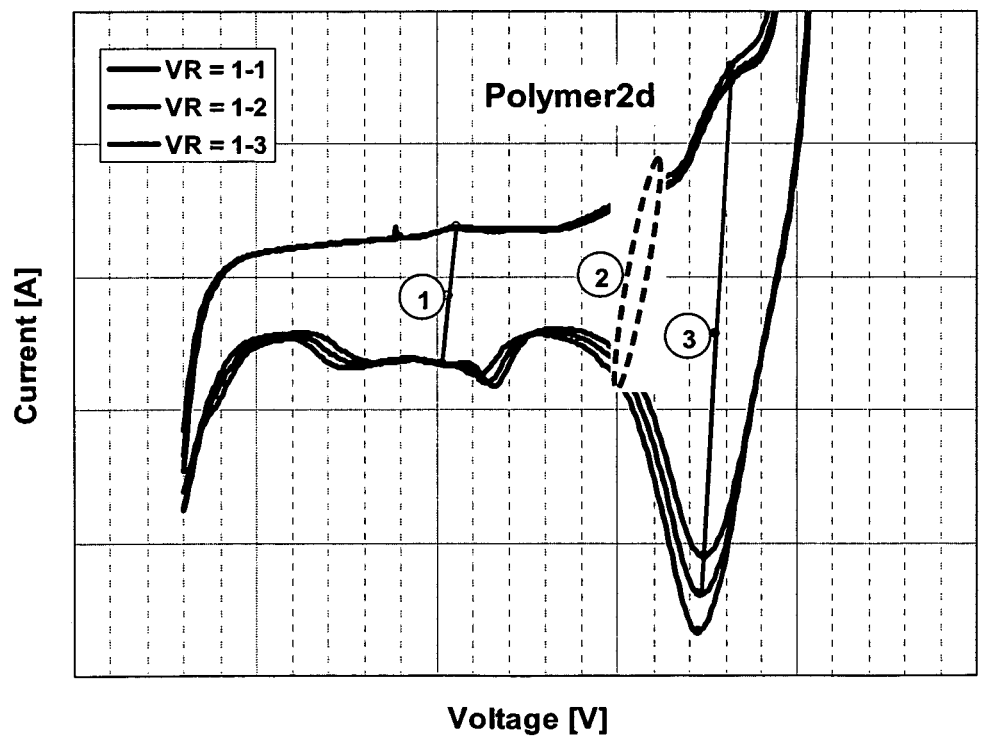
FIG. 4 depicts a CV curve for polymer2d.

The invention relates to a polymer blend comprising
a first polymer (polymer 1) comprising a unit having hole transporting property (hole transporting unit),
a second polymer (polymer 2) comprising a unit having electron transporting property (electron transporting unit) and a unit having exciton formation property (exciton formation unit), and optionally comprising one or more further units having emissive property (emissive unit) and/or exciton formation property, wherein preferably said second polymer comprises at least one unit having emissive property,
wherein each of said units has a HOMO ("highest occupied molecular orbital") and a LUMO ("lowest unoccupied molecular orbital"), and the difference between said HOMO and LUMO is hereinafter referred to as the "energy gap",
wherein the HOMO of both said hole transporting unit of said first polymer and said exciton formation unit of said second polymer are higher, preferably at least 0.2 eV higher, very preferably at least 0.3 eV higher, than the HOMO of said electron transporting unit of said second polymer, with the proviso that a blend that comprises a polymer comprising substituted or unsubstituted fluorene and triarylamine units and further comprises a polymer comprising substituted or unsubstituted fluorene and benzothiadiazol units is excluded.

Preferably the LUMO of said exciton formation unit of the second polymer is higher than the LUMO of said electron transporting unit of the second polymer.

Preferably the HOMO of said hole transporting unit of the first polymer is at least 0.4 eV, very preferably 0.5 eV higher than the HOMO of said electron transporting unit of the second polymer.

Preferably the HOMO of said exciton formation unit of the second polymer is at least 0.4 eV, very preferably 0.5 eV higher than the HOMO of said electron transporting unit of the second polymer.

Optionally the exciton formation unit is itself an emissive unit, i.e. it has exciton formation property and emissive property.

Preferably the second polymer contains one or more additional emissive units, wherein the excitation energy is transferred from exciton formation unit to each of said additional emissive units, preferably by Förster transfer, and the energy gap of each of said additional emissive units is smaller than the energy gap of said exciton formation unit.

Preferably the additional emissive units emit blue, green and/or red light.

Preferably the second polymer has a negligible hole mobility compared to the first polymer, i.e. 3 or more than 3 orders of magnitudes lower than the hole mobility of the first polymer.

Preferably the first polymer has a negligible electron mobility compared to the second polymer, i.e. 3 or more than 3 orders of magnitudes lower than the electron mobility of the second polymer.

Preferably the first and second polymer are conjugated polymers.

Optionally, the first polymer comprises one or more further emissive units, which do preferably have a lower HOMO than the HOMO of said hole transporting unit of the first polymer and a higher LUMO than the LUMO of said electron transporting unit of the second polymer, and accept excitation energy from said exciton formation unit of the second polymer by energy transfer, preferably by Förster transfer.

The invention further relates to the use of the polymer blends as described above and below in an electronic or electrooptical device, in particular in polymer light emitting diodes (PLED).

The invention further relates to an electronic or electrooptical device, in particular a PLED, comprising a polymer blend as described above and below.

Further electronic or electrooptical devices include, without limitation, an organic field effect transistor (OFET), thin film transistor (TFT), organic solar cell (O-SC), organic laser diode (O-laser), organic integrated circuit (O-IC), radio frequency identification (RFID) tag, photodetector, sensor, logic circuit, memory element, capacitor, charge injection layer, Schottky diode, planarising layer, antistatic film, conducting substrate, conducting pattern, photoconductor, electrophotographic element, or organic light emitting transistor (OLET).

The invention further relates to an electronic device comprising an anode, a cathode, a semiconductor or emissive layer comprising a polymer blend as described above and below, and an interlayer comprising a material having hole transporting and electron blocking property provided between the anode and the semiconductor or emissive layer. A device with such an interlayer is generally described in WO 2004/084260 A2.

The invention further relates to an electronic device comprising a polymer blend as described above and below, and further comprising a conductive polymer layer and/or a hole transporting layer, wherein the polymer blend is coated directly onto said conductive polymer and/or hole transporting layer.

The invention further relates to an electronic device comprising, in the sequence as described below
optionally a first substrate,
an anode layer,
optionally a hole injection layer,
optionally an interlayer comprising a material having electron blocking property,
a layer comprising a polymer blend as described above and below,
a cathode layer,
optionally a second substrate.

The second polymer itself is another object of the invention. Thus, the invention also relates to a polymer comprising an electron transporting unit and an exciton formation unit, and optionally comprising one or more further emissive units and/or exciton formation units, wherein each of said units has a HOMO and a LUMO, and the HOMO of said first exciton formation unit is at least 0.2, preferably at least 0.3 eV higher than the HOMO of said electron transporting unit. Preferably the polymer comprises at least one emissive unit. Further preferably the polymer is a polymer as described for polymer 2 above and below.

DEFINITION OF TERMS

"Hole transport property" refers to a material or unit capable of transporting holes (i.e. positive charges) injected from a hole injecting material or an anode. "Electron transporting property" refers to a material or unit capable of transporting electrons (i.e. negative charges) injected from an electron injecting material or a cathode. "Exciton formation property" refers to a material or unit, wherein holes and electrons can recombine to form an exciton, or which can form an exciton by optical excitation, i.e. by absorbing one photon. "Emissive property" refers to a material or unit which, upon receiving excitonic energy by energy transfer from other units, or by forming an exciton either electrically or optically, undergoes radiative decay to emit light.

"Electron blocking property" refers to a material or unit which, if coated adjacent to an electron transporting layer in a multilayer structure, prevents the electron flowing through. Usually it has a higher LUMO than the electron transporting material in the adjacent electron transporting layer.

"Backbone group", unless stated otherwise, means the group/groups that has/have the highest content of all groups present in a polymer, preferably with a ratio ≥20%, very preferably ≥30%, in particular ≥40%, most preferably ≥50%. Backbone groups can also form electron transporting units, hole transporting units, exciton formation units or emissive units either alone or in combination with other groups. For example, if there are two groups whose contents are clearly higher than those of the other groups present in the polymer, or if there are only two groups present in a polymer, then both groups are considered as backbone groups. Preferably the backbone groups are hole transporting groups or electron transporting groups.

The term "polymer" includes homopolymers and copolymers, e.g. statistical, alternating or block copolymers. In addition, the term "polymer" as used hereinafter does also include dendrimers, which are typically branched macromolecular compounds consisting of a multifunctional core group onto which further branched monomers are added in a regular way giving a tree-like structure, as described for example in M. Fischer and F. Vögtle, *Angew. Chem., Int. Ed.* 1999, 38, 885.

The term "conjugated polymer" means a polymer containing in its backbone (or main chain) mainly C atoms with $sp^2$-hybridisation (or optionally also sp-hybridisation), which may also be replaced by hetero atoms. In the simplest case this is for example a backbone with alternating C—C single and double (or triple) bonds, but does also include polymers with units like 1,3-phenylene. "Mainly" means in this connection that a polymer with naturally (spontaneously) occurring defects, which may lead to interruption of the conjugation, is still regarded as a conjugated polymer. Also included in this meaning are polymers wherein the backbone comprises for example units like aryl amines, aryl phosphines and/or certain heterocycles (i.e. conjugation via N-, O-, P- or S-atoms) and/or metal organic complexes (i.e. conjugation via a metal atom).

The term "unit" in a polymer according to the present invention means a repeating unit in a polymer, which may consist of a single monomeric group or may also be formed by two or more monomeric groups. For example, an emissive unit may be formed by an emitter group $A^{em}$ and two polymer backbone groups B and is then given by the formula B-$A^{em}$-B. Unless stated otherwise, the quantum chemistry simulation (as described above) is carried out on units of this formula.

The units in polymer 1 and 2 of this invention are preferably of the formula —B-$A^x$-B-, wherein the groups B denote independently of one another identical or different backbone groups, preferably the same backbone group, and $A^x$ is a group selected from groups having hole transporting property ($A^h$), electron transporting property ($A^e$), exciton formation property ($A^{ex}$), or emissive property ($A^{em}$). Thus, polymer 1 preferably comprises one or more hole transporting units of formula -B-$A^h$-B-, wherein $A^h$ is a group having hole transport property. Polymer 2 preferably comprises one or more electron transporting units of formula -B-$A^e$-B-, wherein $A^e$ is a group having electron transport property, and one or more exciton formation units of formula -B-$A^{ex}$-B-, wherein $A^{ex}$ is a group having exciton formation property. Furthermore, at least one of polymers 1 and 2, preferably polymer 2, preferably comprises one or more emissive units of formula -B-$A^{em}$-B-, wherein $A^{em}$ is a group having emissive property.

However, it is also possible that polymer 1 and/or polymer 2 comprise one or more units formed by single groups B, $A^h$, $A^e$, $A^{ex}$, $A^{em}$, which are not present in form of triads B-$A^x$-B as described above.

Some important energy levels will be explained hereinafter. For conjugated polymers, important characteristic are the binding energies, which are measured with respect to the vacuum level of the electronic energy levels, especially the "highest occupied molecular orbital" (HOMO), and "lowest unoccupied molecular orbital" (LUMO) levels. These can be measured by photoemission, e.g. XPS (X-ray photoelectron spectroscopy) and UPS (ultra-violet photoelectron spectroscopy) or by cyclovoltammetry (hereinafter referred to as CV) for oxidation and reduction. It is well understood in the field that the absolute energy levels are dependent of the method used, and even of the evaluation method for the same method, for example the onset point and peak point on the CV curved give different values. Therefore, a reasonable comparison should be made by the same evaluation method of the same measurement method. More recently, the quantum chemistry method, for example Density Function Theory (hereinafter referred to as DFT), has also become well-established to calculate the molecular orbital, particularly the occupied molecular orbitals; and especially the HOMO levels can be well estimated by this method. Therefore, with the help of DFT, given by commercially available software like for example "Gaussian 03W" (Gaussian, Inc.), the HOMO/LUMO of the different units in the conjugated polymers can be calculated.

The applicants established a very consistent combination method to determine the energy levels of organic materials. The HOMO/LUMO levels of a set of materials (more than 20 different materials) are measured by CV with a stable evaluation method and also calculated by the DFT of Gaussian 03W with the same correction functional, for example B3PW91 and the same basis set, for example 6-31G(d). The calculated values are then calibrated according to the measured values. Such calibration factor is used for further calculation. As will be shown below, the agreement between calculation and measurement is very good. Therefore, the comparison of the energy levels of this invention is set on a sound base. In doing so, the applicants found that for most of the groups that are equal to or larger than biphenyl, the simulation on the above-mentioned triads, like for example -B-$A^h$-B-, gives very consistent results.

For determination of energy gaps or bandgaps, the energy levels like the HOMO of different units should be measured or calculated with the same method. The preferred methods used in this invention are calibrated DFT method and CV measurement, most preferably calibrated DFT method, particularly when the concentration of the unit is low in the polymer.

Unless stated otherwise, the values for the energy gap or bandgap given throughout this invention are obtained by the calibrated DFT method.

It should also be pointed out that the HOMO of the entire conjugated polymer is determined by the highest HOMO of its different units, and the LUMO of the entire conjugated polymer is determined by the lowest LUMO of its different units. Therefore, the HOMO of said second polymer can be determined by the HOMO of its exciton formation unit, and the LUMO of said second polymer can be determined by the LUMO of its electron transport unit.

Unless stated otherwise, groups or indices like $Ar^1$, $R^1$, a etc. in case of multiple occurrence are selected independently from each other and may be identical or different from each other. Thus, several different groups might be represented by a single label like "$R^1$".

The term "aryl" or "arylene" means an aromatic hydrocarbon group or a group derived from an aromatic hydrocarbon group. The term "heteroaryl" or "heteroarylene" means an "aryl" or "arylene" group comprising one or more hetero atoms. The terms "alkyl", "aryl", "heteroaryl" etc. also include multivalent species, for example alkylene, arylene, "heteroarylene" etc.

The term "carbyl group" as used above and below denotes any monovalent or multivalent organic radical moiety which comprises at least one carbon atom either without any non-carbon atoms (like for example —C≡C—), or optionally combined with at least one non-carbon atom such as N, O, S, P, Si, Se, As, Te or Ge (for example carbonyl etc.). The terms "hydrocarbon group", and "hydrocarbyl group" denote a carbyl group that does additionally contain one or more H atoms and optionally contains one or more hetero atoms like for example N, O, S, P, Si, Se, As, Te or Ge.

A carbyl or hydrocarbyl group comprising a chain of 3 or more C atoms may be linear, branched and/or cyclic, including spiro and/or fused rings.

Preferred carbyl and hydrocarbyl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, very preferably 1 to 18 C atoms, furthermore optionally substituted aryl or aryloxy having 6 to 40, preferably 6 to 25 C atoms, furthermore alkylaryl, arylalkyl, alkylaryloxy, arylalkyloxy arylcarbonyl, aryloxycarbonyl, arylcarbonyloxy and aryloxycarbonyloxy, each of which is optionally substituted and has 6 to 40, preferably 6 to 25 C atoms.

The carbyl or hydrocarbyl group may be a saturated or unsaturated acyclic group, or a saturated or unsaturated cyclic group. Unsaturated acyclic or cyclic groups are preferred, especially alkenyl and alkinyl groups (especially ethinyl). Where the $C_1$-$C_{40}$ carbyl or hydrocarbyl group is acyclic, the group may be linear or branched.

The $C_1$-$C_{40}$ carbyl or hydrocarbyl group includes for example: $C_1$-$C_{40}$ alkyl, $C_2$-$C_{40}$ alkenyl, $C_2$-$C_{40}$ alkinyl, $C_3$-$C_{40}$ alkyl group, $C_4$-$C_{40}$ alkyldienyl, $C_4$-$C_{40}$ polyenyl, $C_6$-$C_{40}$ aryl, $C_6$-$C_{40}$ aryloxy, $C_6$-$C_{40}$ alkylaryl, $C_6$-$C_{40}$ arylalkyl, $C_6$-$C_{40}$ alkylaryloxy, $C_6$-$C_{40}$ arylalkyloxy, $C_6$-$C_{40}$ heteroaryl, $C_4$-$C_{40}$ cycloalkyl, $C_4$-$C_{40}$ cycloalkenyl, and the like. Very preferred are $C_1$-$C_{20}$ alkyl, $C_2$-$C_{20}$ alkenyl, $C_2$-$C_{20}$ alkinyl, $C_3$-$C_{20}$ alkyl, $C_4$-$C_{20}$ alkyldienyl, $C_6$-$C_{12}$ aryl, $C_6$-$C_{20}$ arylalkyl and $C_6$-$C_{20}$ heteroaryl.

Further preferred carbyl and hydrocarbyl groups include straight-chain, branched or cyclic alkyl with 1 to 40, preferably 1 to 25 C-atoms, which is unsubstituted, mono- or polysubstituted by F, Cl, Br, I or CN, and wherein one or more non-adjacent $CH_2$ groups are optionally replaced, in each case independently from one another, by —O—, —S—, —NH—, —$NR^0$—, —$SiR^0R^{00}$—, —CO—, —COO—, —OCO—, —O—CO—O—, —S—CO—, —CO—S—, —CO—$NR^0$—, —$NR^0$—CO—, —$NR^0$—CO—$NR^{00}$—, —$CY^1$=$CY^2$— or —C≡C— in such a manner that O and/or S atoms are not linked directly to one another, wherein $Y^1$ and $Y^2$ are independently of each other H, F, Cl or CN, and $R^0$ and $R^{00}$ are independently of each other H or an optionally substituted aliphatic or aromatic hydrocarbon with 1 to 20 C atoms.

$R^0$ and $R^{00}$ are preferably selected from H, straight-chain or branched alkyl with 1 to 12 C atoms or aryl with 6 to 12 C atoms.

Halogen is F, Cl, Br or I.

Preferred alkyl groups include, without limitation, methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, 2-ethylhexyl, n-heptyl, cycloheptyl, n-octyl, cyclooctyl, dodecanyl, trifluoromethyl, perfluoro-n-butyl, 2,2,2-trifluoroethyl, perfluorooctyl, perfluorohexyl etc.

Preferred alkenyl groups include, without limitation, ethenyl, propenyl, butenyl, pentenyl, cyclopentenyl, hexenyl, cyclohexenyl, heptenyl, cycloheptenyl, octenyl, cyclooctenyl etc.

Preferred alkinyl groups include, without limitation, ethinyl, propinyl, butinyl, pentinyl, hexinyl, octinyl etc.

Preferred alkoxy groups include, without limitation, methoxy, ethoxy, 2-methoxyethoxy, n-propoxy, i-propoxy, n-butoxy, i-butoxy, s-butoxy, t-butoxy, 2-methylbutoxy, n-pentoxy, n-hexoxy, n-heptoxy, n-octoxy etc.

Preferred amino groups include, without limitation, dimethylamino, methylamino, methylphenylamino, phenylamino, etc.

Aryl groups may be mononuclear, i.e. having only one aromatic ring (like for example phenyl or phenylene), or polynuclear, i.e. having two or more aromatic rings which may be fused (like for example napthyl or naphthylene), individually covalently linked (like for example biphenyl), and/or a combination of both fused and individually linked aromatic rings. Preferably the aryl group is an aromatic group which is substantially conjugated over substantially the whole group.

Preferred aryl groups include, without limitation, benzene, biphenylene, triphenylene, [1,1':3',1"]terphenyl-2'-ylene, naphthalene, anthracene, binaphthylene, phenanthrene, pyrene, dihydropyrene, chrysene, perylene, tetracene, pentacene, benzpyrene, fluorene, indene, indenofluorene, spirobifluorene, etc.

Preferred heteroaryl groups include, without limitation, 5-membered rings like pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings like pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, and fused systems like carbazole, indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]thiophene, dithienothiophene, dithienopyridine, isobenzothiophene, dibenzothiophene, benzothiadiazothiophene, or combinations thereof. The heteroaryl groups may be substituted with alkyl, alkoxy, thioalkyl, fluoro, fluoroalkyl or further aryl or heteroaryl substituents.

Preferred arylalkyl groups include, without limitation, 2-tolyl, 3-tolyl, 4-tolyl, 2,6-dimethylphenyl, 2,6-diethylphenyl, 2,6-di-1-propylphenyl, 2,6-di-t-butylphenyl, o-t-butylphenyl, m-t-butylphenyl, p-t-butylphenyl, 4-phenoxyphenyl, 4-fluorophenyl, 3-carbomethoxyphenyl, 4-carbomethoxyphenyl etc.

Preferred alkylaryl groups include, without limitation, benzyl, ethylphenyl, 2-phenoxyethyl, propylphenyl, diphenylmethyl, triphenylmethyl or naphthalinylmethyl.

Preferred aryloxy groups include, without limitation, phenoxy, naphthoxy, 4-phenylphenoxy, 4-methylphenoxy, biphenyloxy, anthracenyloxy, phenanthrenyloxy etc.

The aryl, heteroaryl, carbyl and hydrocarbyl groups optionally comprise one or more substituents, preferably selected from silyl, sulpho, sulphonyl, formyl, amino, imino, nitrilo, mercapto, cyano, nitro, halogen, $C_{1-12}$alkyl, $C_{6-12}$ aryl, $C_{1-12}$ alkoxy, hydroxy and/or combinations thereof. The optional substituents may comprise all chemically possible combinations in the same group and/or a plurality (preferably two) of the aforementioned groups (for example amino and sulphonyl if directly attached to each other represent a sulphamoyl radical).

Preferred substituents include, without limitation, solubilising groups such as alkyl or alkoxy, electron withdrawing groups such as fluorine, nitro or cyano, and substituents for increasing glass transition temperature of the polymer such as bulky groups, e.g. t-butyl or optionally substituted aryl.

Preferred substituents include, without limitation, F, Cl, Br, I, —CN, —NO$_2$, —NCO, —NCS, —OCN, —SCN, —C(=O)NR$^0$R$^{00}$, —C(=O)X$^0$, —C(=O)R$^0$, —NR$^0$R$^{00}$, optionally substituted silyl, aryl or heteroaryl with 4 to 40, preferably 6 to 20 C atoms, and straight chain or branched alkyl, alkoxy, alkylcarbonyl, alkoxycarbonyl, alkylcarbonloxy or alkoxycarbonyloxy with 1 to 20, preferably 1 to 12 C atoms, wherein one or more H atoms are optionally replaced by F or Cl, wherein $R^0$ and $R^{00}$ are as defined above and $X^0$ is halogen.

DETAILED DESCRIPTION OF THE INVENTION

By using a polymer blend of the present invention comprising a hole conducting polymer (polymer 1) and an electron conducting polymer (polymer 2) as LEP in a single layer PLED device, it is possible to achieve a lifetime that is longer than in a multilayer PLED device using polymer 1 as interlayer and polymer 2 as LEP.

In a PLED device according to the present invention it is desired, and therefore preferred, to keep the exciton density as low as possible on the backbones of the polymers forming the blend, i.e. the electron transporting backbone in case of polymer 2, and hole transporting backbone in case of polymer 1. In other words, it is preferred to maintain the polymer backbones in a single carrier state, and to keep the excitons mainly only on exciton formation or emissive units. This is achieved by using a blend system containing polymer 1 and polymer 2, wherein both the hole transporting unit of said polymer 1 and the exciton formation unit of said polymer 2 have HOMOs that are preferably at least 0.3 eV, very preferably 0.4 eV, most preferably 0.5 eV higher than the electron transporting unit of polymer 2; and polymer 2 contains at least one exciton formation unit, preferably whose HOMO is higher than the HOMO of the backbone unit of polymer 1, and a LUMO that is higher than the backbone unit of polymer 2. The exciton formation unit is itself an emissive unit if a) there is no energy transfer to further emissive unit, or b) no further emissive unit is present either in polymer 1 or polymer 2, or c) the energy transfer to the further emissive units is only partial.

The ratio of the hole transporting unit in polymer 1 is preferably from 25 to 99 mol %.

The ratio of the electron transporting unit in polymer 2 is preferably from 25 to 99 mol %.

The ratio of the exciton formation unit in polymer 2 is preferably from 0.01 to 10 mol %, very preferably from 0.01 to 4 mol %, most preferably from 0.01 to 2.5 mol %. For some uses a polymer 2 wherein the ratio of the exciton formation unit is at least 0.1 mol % is preferred.

The ratio of the further emissive units in polymer 2 and/or polymer 1 is preferably from 0.01 to 10 mol %, very preferably from 0.01 to 4 mol %; most preferably from 0.01 to 2.5 mol %. For some uses a polymer 2 wherein the ratio of the further emissive units is at least 0.1 mol % is preferred.

The proportion of polymer 1 in the blend is preferably from 0.1 to 50 mol %, very preferably from 5 to 25 mol %, most preferably from 10 to 20 mol %.

The proportion of polymer 2 in the blend is preferably from 50 to 99.9 mol %, very preferably from 75 to 95 mol %, most preferably from 80 to 90 mol %.

Especially preferred is a blend consisting exclusively of polymer 1 and polymer 2.

The weight average molecular weight $M_w$ of polymer 1 in the blend is preferably from 10,000 to 900,000, very preferably from 50,000 to 500,000, most preferably from 200,000 to 400,000.

The weight average molecular weight $M_w$ of polymer 2 in the blend is preferably from 10,000 to 900,000, very preferably from 50,000 to 500,000, most preferably from 200,000 to 400,000.

In addition to polymers 1 and 2, the polymer blend may comprise one or more further polymers, preferably selected from polymers having one or more of electron conducting, hole conducting, exciton formation and emissive property.

Preferably polymer 1 and 2 comprise one or more groups $A^x$ and B as defined above selected from phenylene, biphenylene, napthalene, anthracene, phenanthrene, dihydrphenanthrene, fluorene, bifluorene, spirobifluorene, phenylene-vinylene, carbazole, pyrene, perylene, 9,10-dihydrophenan-threne, fused thiophene like thieno[2,3b]thiophene or thieno[3,2b]thiophene, dithienothiophene, dibenzothiphene, phenanthroline, trans-indenofluorene, cis-indenonfluorene, debenzolindenofluorene, indenonaphtharene, triarylamine, or derivatives thereof.

Preferred backbone groups B are those of formula I (cis- or trans-indenofluorene derivatives)

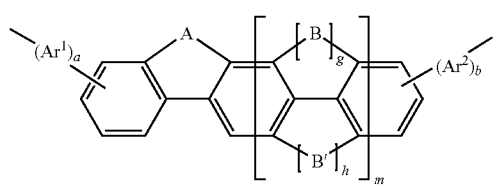

I wherein

A, B and B' are independently of each other, and in case of multiple occurrence independently of one another, a divalent group, preferably selected from —CR¹R²—, —NR¹—, —PR¹—, —O—, —S—, —SO—, —SO₂—, —CO—, —CS—, —CSe—, —P(=O)R¹—, —P(=S)R¹— and —SiR¹R²—, R¹ and R² are independently of each other identical or different groups selected from H, halogen, —CN, —NC, —NCO, —NCS, —OCN, —SCN, —C(=O)NR⁰R⁰⁰, —C(=O)X, —C(=O)R⁰, —NH₂, —NR⁰R⁰⁰, —SH, —SR⁰, —SO₃H, —SO₂R⁰, —OH, —NO₂, —CF₃, —SF₅, optionally substituted silyl, or carbyl or hydrocarbyl with 1 to 40 C atoms that is optionally substituted and optionally comprises one or more hetero atoms, and optionally the groups R¹ and R² form a spiro group with the fluorene moiety to which they are attached, X is halogen, R⁰ and R⁰⁰ are independently of each other H or an optionally substituted carbyl or hydrocarbyl group optionally comprising one or more hetero atoms, each g is independently 0 or 1 and each corresponding h in the same subunit is the other of 0 or 1, m is an integer≥1, Ar¹ and Ar² are independently of each other mono- or polynuclear aryl or heteroaryl that is optionally substituted and optionally fused to the 7,8-positions or 8,9-positions of the indenofluorene group, a and b are independently of each other 0 or 1, If the groups R¹ and R² form a spiro group with the fluorene group to which they are attached, it is preferably spirobifluorene.

In formula I the term 'subunit' means the group

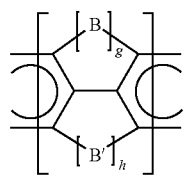

Accordingly, a subunit in formula I wherein g is 1 and h is 0 is of structure Ia, and a subunit wherein g is 0 and h is 1 is of structure Ib:

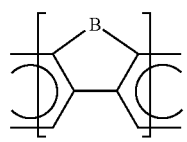

Ia

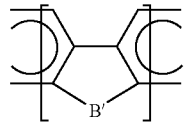

Ib

The groups of formula I are preferably selected from the following subformulae:

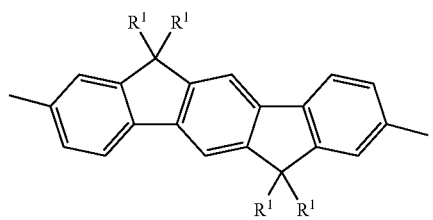

I1

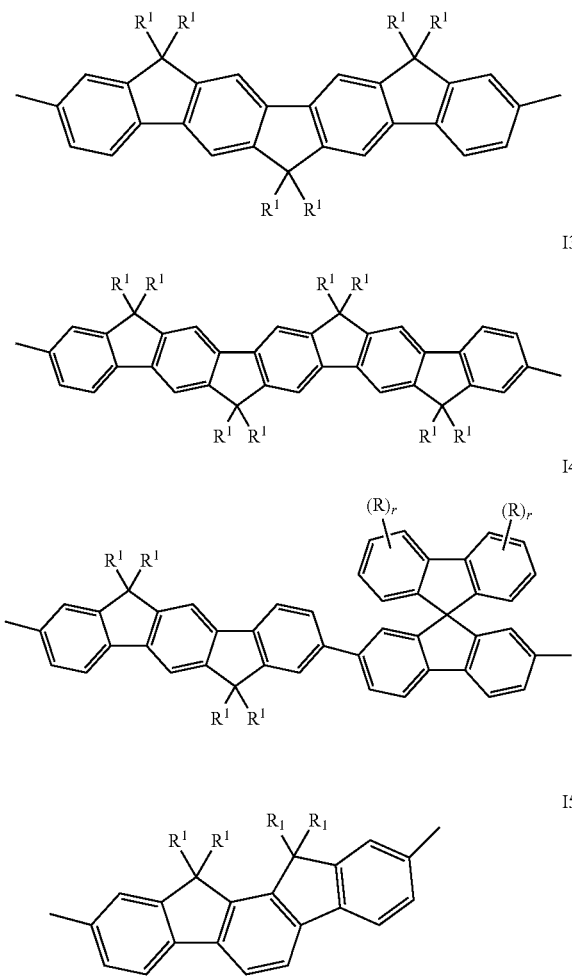

wherein R¹ is as defined in formula I, r is 0, 1, 2, 3 or 4, and R has one of the meanings of R¹.

R is preferably F, Cl, Br, I, —CN, —NO₂, —NCO, —NCS, —OCN, —SCN, —C(═O)NR⁰R⁰⁰, —C(═O)X⁰, —C(═O)R⁰, —NR⁰R⁰⁰, optionally substituted silyl, aryl or heteroaryl with 4 to 40, preferably 6 to 20 C atoms, or straight chain, branched or cyclic alkyl, alkoxy, alkylcarbonyl, alkoxycarbonyl, alkylcarbonlyoxy or alkoxycarbonyloxy with 1 to 20, preferably 1 to 12 C atoms, wherein one or more H atoms are optionally replaced by F or Cl, and wherein R⁰, R⁰⁰ and X⁰ are as defined above.

Preferred groups of formula I are selected from the following subformulae:

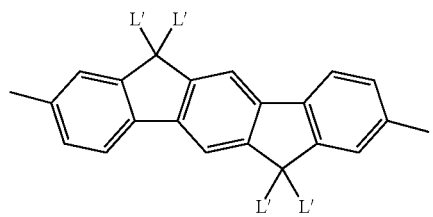

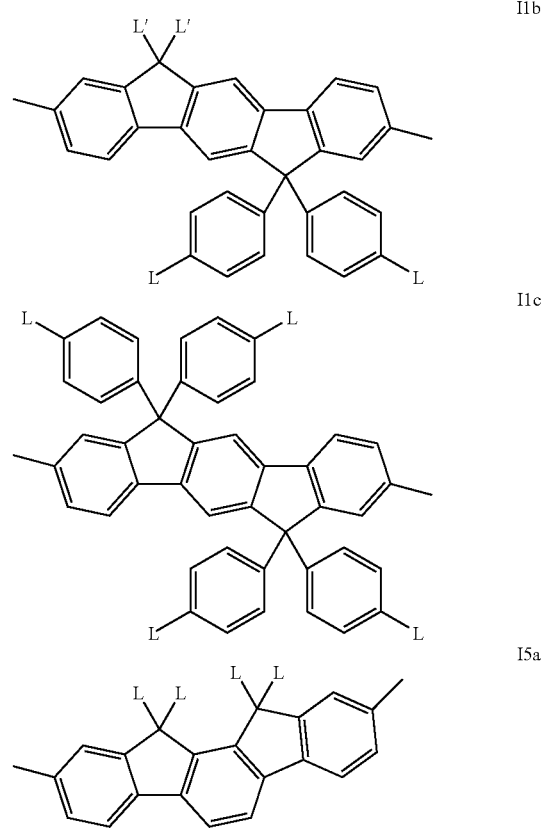

wherein
L is H, halogen or optionally fluorinated, linear or branched alkyl or alkoxy with 1 to 12 C atoms, and is preferably H, F, methyl, i-propyl, t-butyl, n-pentoxy, or trifluoromethyl, and
L' is optionally fluorinated, linear or branched alkyl or alkoxy with 1 to 12 C atoms, and is preferably n-octyl or n-octyloxy.

The groups of formula I are also suitable as electron transporting groups $A^e$ when used with other groups with low LUMO, especially preferably those of formula I1, very preferably those of formula I1b.

The total ratio of groups of formula I in polymer 1 is preferably from 10 to 80, very preferably from 30 to 70, most preferably from 40 to 60 mol %.

The total ratio of groups of formula I in polymer 2 is preferably from 1 to 95%, very preferably from 5 to 60% and most preferably from 10 to 50 mol %.

Preferred hole transporting groups $A^h$ are those of formula II (triarylamine derivatives):

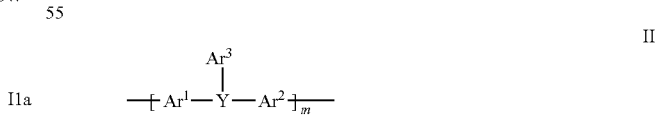

wherein
Y is N, P, P═O, PF₂, P═S, As, As═O, As═S, Sb, Sb═O or Sb═S, preferably N,
Ar¹ which may be the same or different, denote, independently if in different repeat units, a single bond or an optionally substituted mononuclear or polynuclear aryl group, Ar² which may be the same or different, denote, independently if in different repeat units, an optionally substituted mononuclear or polynuclear aryl group, Ar³ which may be the same or different, denote, independently if in different repeat units, an optionally substituted mononuclear or polynuclear aryl group, which may be optionally substituted by a bridging group linking different chain residues of formula II, and m is 1, 2 or 3.

The groups of formula II are preferably selected from the following subformulae:

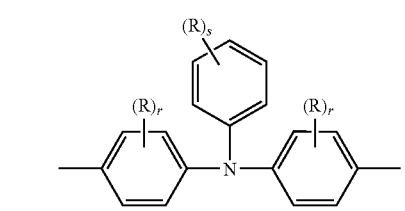

II1

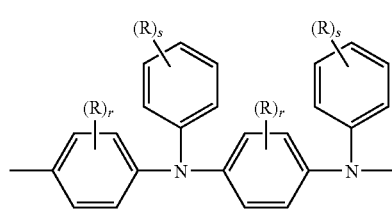

II2

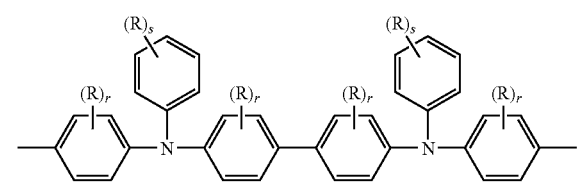

II3 wherein R and r are as defined above and s is 0, 1, 2, 3, 4 or 5.

Particularly preferred groups of formula II are selected from the following subformulae:

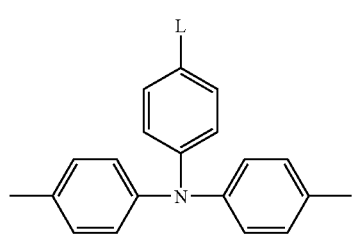

II1a

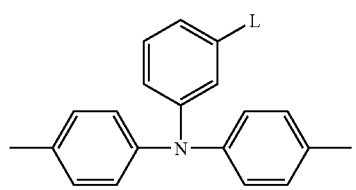

II1b

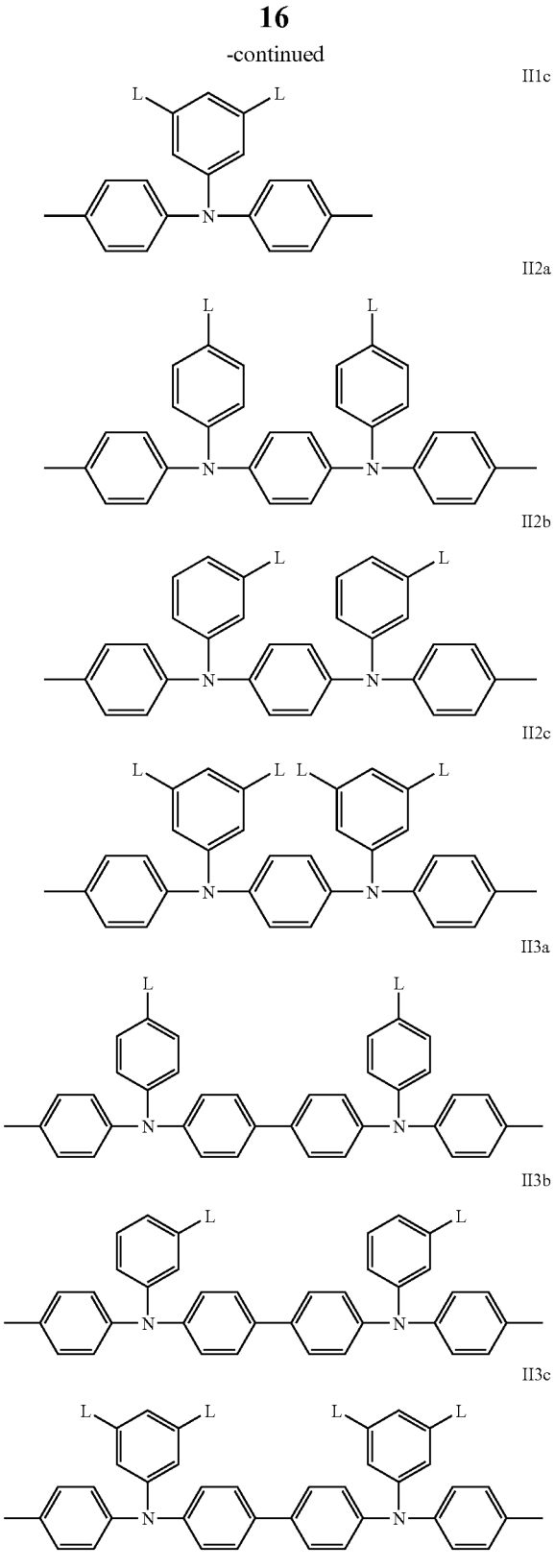

wherein L is as defined above.

Very preferred hole transporting groups $A^h$ are those of formula II1.

The groups of formula II are also suitable as exciton formation groups $A^{ex}$, especially preferably those of formula II2.

The total ratio of groups of formula II in polymer 1 is preferably from 10 to 80, very preferably from 30 to 70, most preferably from 40 to 60 mol %.

The total ratio of groups of formula II in polymer 2 is preferably from 0.01 to 10%, very preferably from 0.1 to 5% and most preferably from 1 to 2.5 mol %.

Polymer 2 may comprise one or more groups of formula I and one or more groups of formula II as exciton formation unit, or as part of an exciton formation unit, in a concentration so that they act as hole trap instead of hole transport material. Typical concentrations are from 0.01 to 10%, very preferably from 0.1 to 5% and most preferably from 1 to 2.5 mol %.

Further preferred hole transporting groups $A^h$ are those of formula III (thiophene derivatives):

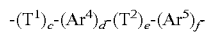

wherein

T$^1$ and T$^2$ are independently of each other selected from thiophene, selenophene, thieno[2,3b]thiophene, thieno[3,2b]thiophene, dithienothiophene and pyrrole, all of which are optionally substituted with one or more identical or different groups R$^5$, Ar$^4$ and Ar$^5$ are independently of each other mononuclear or polynuclear aryl or heteroaryl, which is optionally substituted with one or more identical or different groups R$^5$, and is optionally fused to the 2,3-positions of one or both of the adjacent thiophene or selenophene groups, R$^5$ has in case of multiple occurrence independently of one another one of the meanings of R$^1$ in formula I that is different from H, and optionally two or more groups R$^5$ form a fused ring group with one or more of the groups T$^{1,2}$ and Ar$^{4,5}$, wherein said fused ring group is fully or partially unsaturated and optionally substituted, c and e are independently of each other 0, 1, 2, 3 or 4, with 1<c+e≤6, d and f are independently of each other 0, 1, 2, 3 or 4.

The groups T$^1$ and T$^2$ are preferably selected of

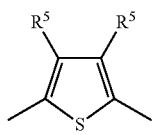

thiophene-2,5-diyl,

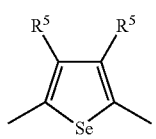

selenophene-2,5-diyl,

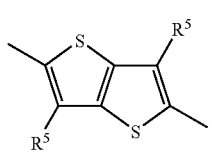

thieno[3,2b]thiophene-2,5-diyl,

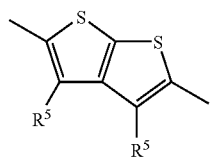

thieno[2,3b]thiophene-2,5-diyl,

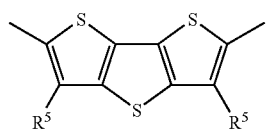

dithienothiophene-2,6-diyl or

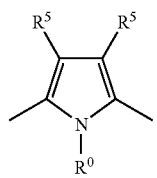

pyrrole-2,5-diyl, wherein R$^0$ is as defined in formula I and R$^5$ is as defined in formula III.

The groups of formula III are preferably selected from the following subformulae:

III1

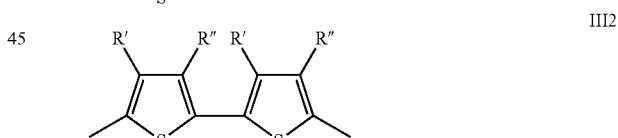

III2

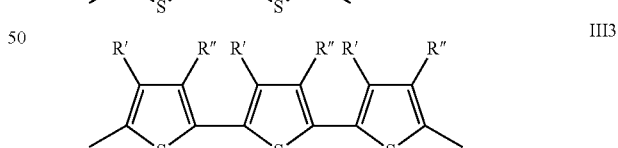

III3

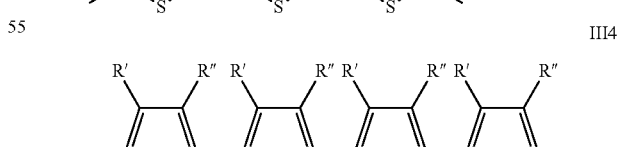

III4

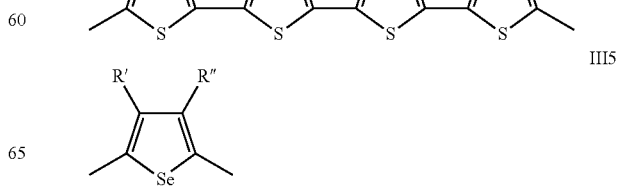

III5

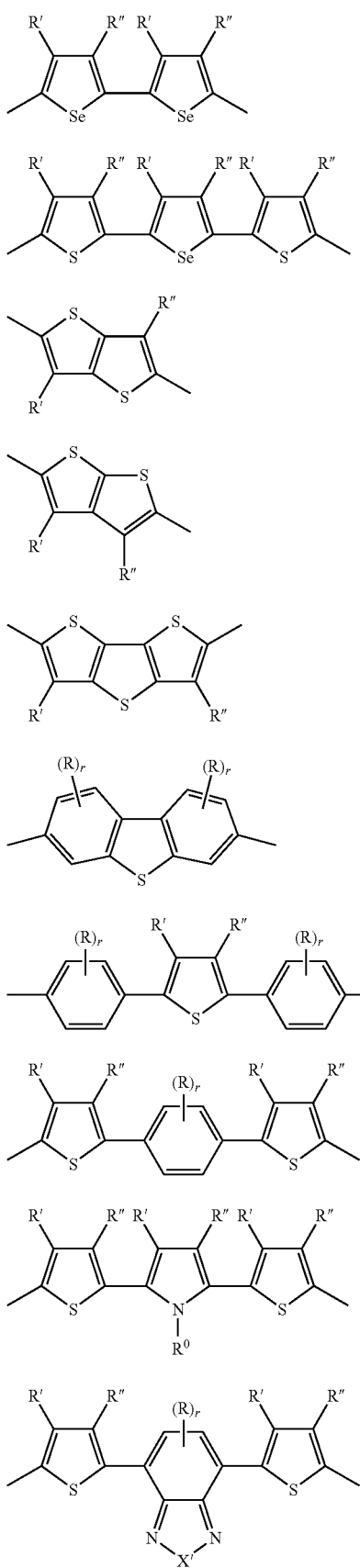
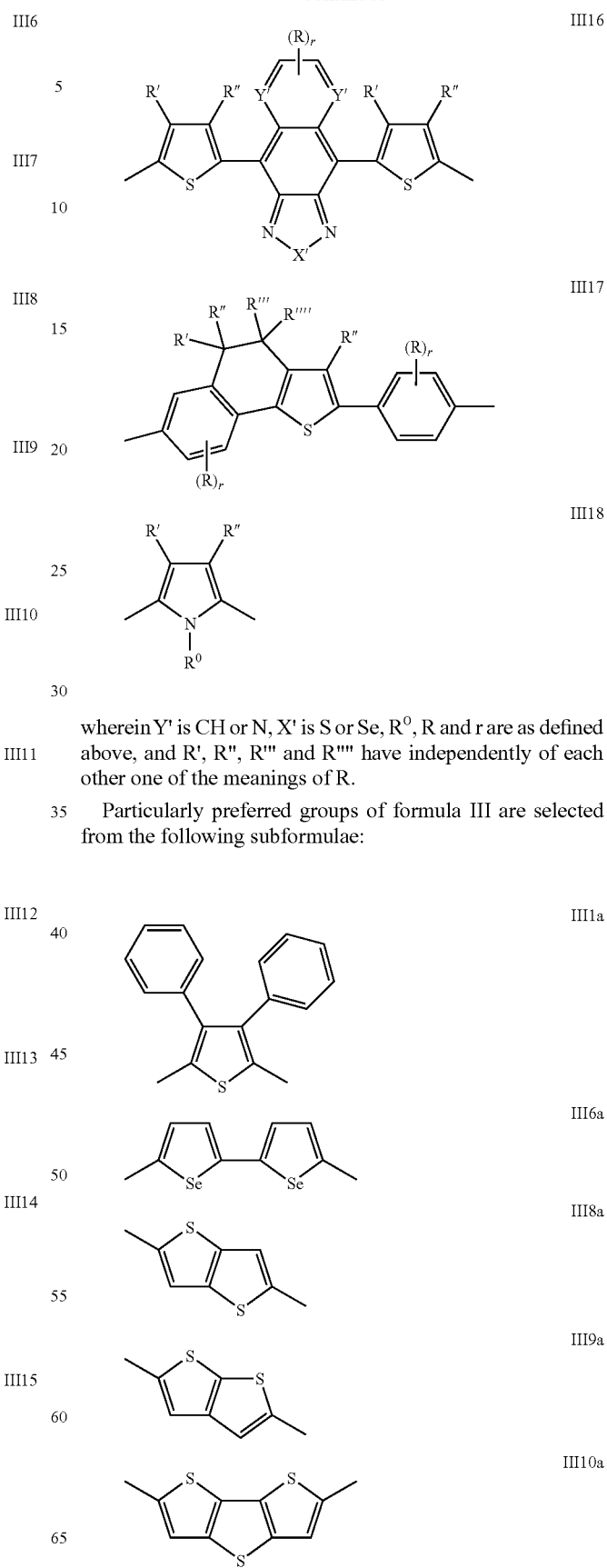
wherein Y' is CH or N, X' is S or Se, R⁰, R and r are as defined above, and R', R", R'" and R"" have independently of each other one of the meanings of R.
Particularly preferred groups of formula III are selected from the following subformulae:
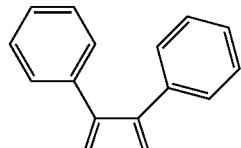
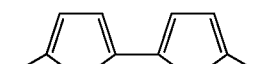
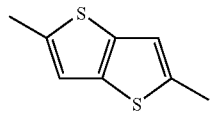
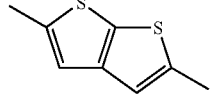
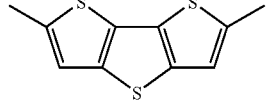

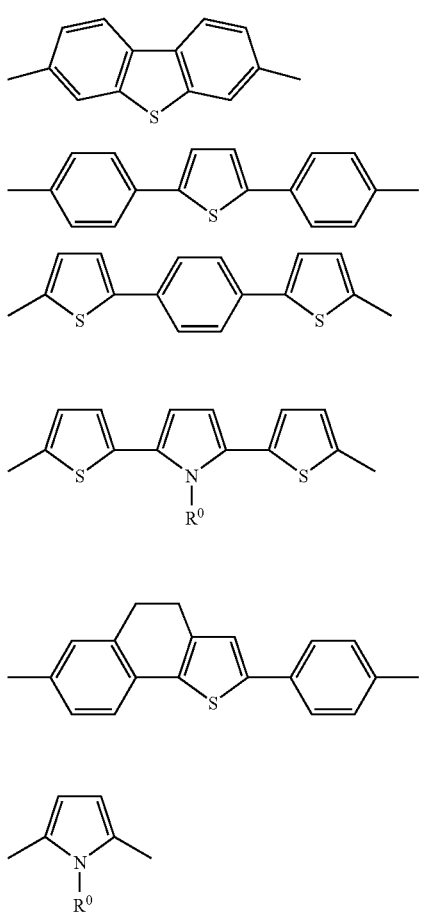

wherein the thiophene, thienothiophene and phenyl groups may also be substituted with one or more groups R' as defined above, R⁰ is as defined above and is preferably $C_{1-8}$-alkyl, very preferably methyl.

The ratio of units of formula III in polymer 1 is preferably from 10 to 80, very preferably from 30 to 70, most preferably from 40 to 60 mol %.

In addition to the groups of formula I, II and/or III as disclosed above and below, polymer 1 may comprise one or more further groups preferably selected from groups have hole transporting properties. Suitable hole transporting groups $A^h$ include, without limitation benzidine, triarylphosphine, phenothiazine, phenoxazine, dihydrophenazine, thianthrene, dibenzo-p-dioxine, phenoxathiine, carbazole, azulene, pyrrole and furan derivatives, or further O-, S- or N-containing heterocycles preferably having a high HOMO. The amount of said additional groups in the polymer is preferably from 1 to 15 mol %.

In addition, polymer 2 may comprise one or more units of formula I and one or more units of formula II as exciton formation unit in a concentration so that they act as hole trap instead of hole transport material. Typical concentrations are from 0.01 to 15, very preferably from 0.1 to 10, most preferably from 1 to 5 mol %.

Further preferred backbone groups B are those of formula IV (phenanthrene derivatives), as disclosed for example in WO 2005/104264 A1:

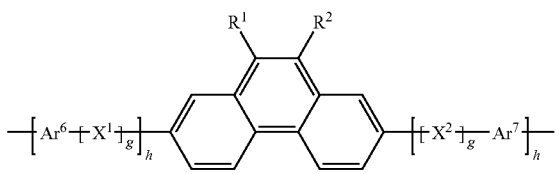

wherein
R¹ and R² have independently of each other one of the meanings given in formula I,
X¹ and X² are independently of each other —CR¹=CR¹—, —C≡C— or —N—Ar⁸—
$Ar^{6-8}$ are in case of multiple occurrence independently of one another a bivalent aromatic or heteroaromatic ring system having from 2 to 40 C atoms, which is optionally substituted by one or more groups R¹ as defined in formula I,
g is in each occurrence independently of one another 0 or 1,
h is in each occurrence independently of one another 0, 1 or 2.

The groups of formula IV are preferably selected from the following subformulae:

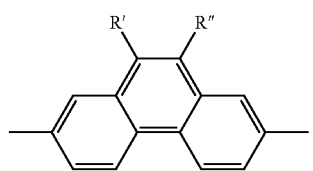

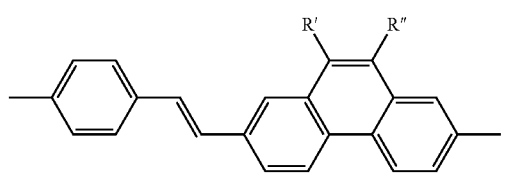

wherein R' and R" are as defined above, and are preferably alkyl or alkoxy with 1 to 12 C atoms or aryl or heteroaryl with 5 to 12 C atoms that is optionally substituted.

The ratio of the groups of formula IV in polymer 2 is preferably from 1 to 95%, very preferably from 5 to 60%, and most preferably from 10 to 50 mol %.

Further preferred backbone groups B are those of formula V (dihydrophenan-threne derivatives) as disclosed for example in WO 2005/014689 A2:

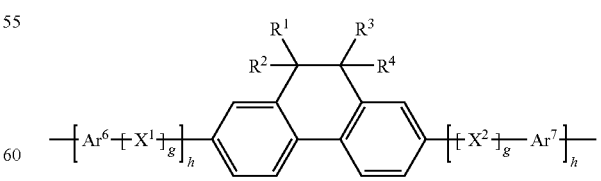

wherein R¹ and R² are as defined in formula I, R³ and R⁴ have independently of each other one of the meanings of R¹, and $Ar^{6,7}$, $X^{1,2}$, g and h are as defined in formula IV.

The groups of formula V are preferably selected from the following subformulae.

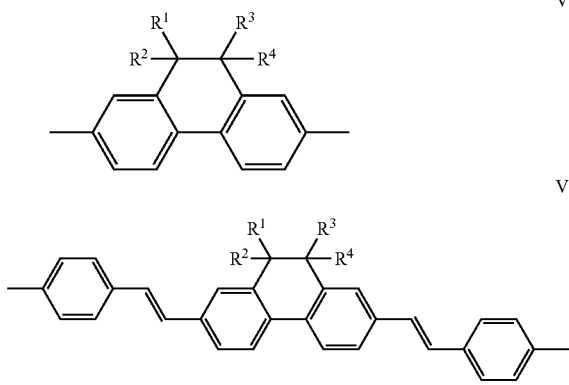

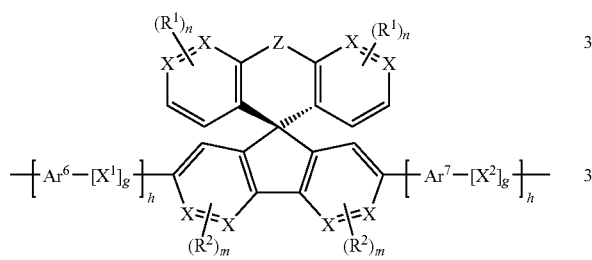

wherein $R^{1-4}$ are as defined above.

The total ratio of groups of formula V in polymer 2 is preferably from 1 to 90%, very preferably from 5 to 60%, and most preferably from 10 to 50 mol %.

The groups of formula V2 are also suitable as emissive groups $A^{em}$.

Further preferred backbone groups B are those of formula VI (spirobifluorene derivatives), as disclosed for example in WO 03/020790 A1:

VI

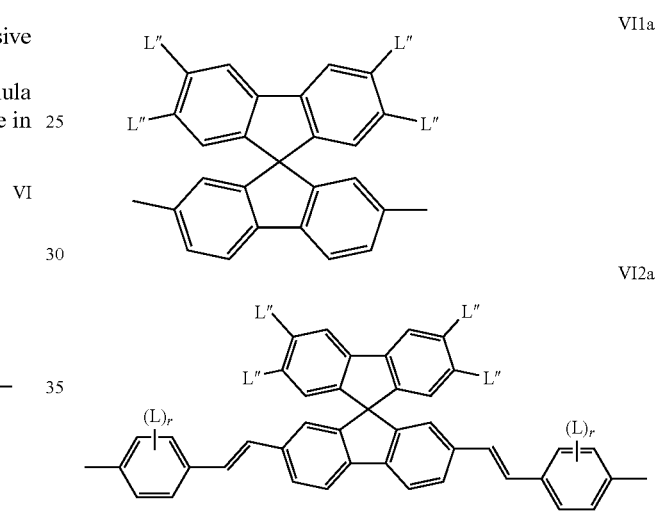

wherein $Ar^{6,7}$, $X^{1,2}$, g and h are as defined in formula IV,
X is in each occurrence independently of one another CH, $CR^1$ or N,
Z is in each occurrence independently of one another a single bond, $CR^5R^6$, $CR^5R^6—CR^5R^6$, $CR^5=CR^6$, O, S, N—$R^5$, C=O, C=$CR^5R^6$ or Si$R^5R^6$;
$R^{1,2}$ have independently of each other the meanings given in formula I,
$R^{5,6}$ have independently of each other one of the meanings of for $R^1$,
m is in each occurrence independently of one another 0, 1, 2, or 3, preferably 0, 1, or 2, very preferably 0 or 1,
n is in each occurrence independently of one another 0, 1, 2, 3, or 4, preferably 0, 1, or 2, very preferably 1 or 2.

The groups of formula VI are preferably selected from the following subformulae:

VI1

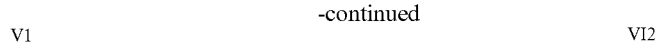

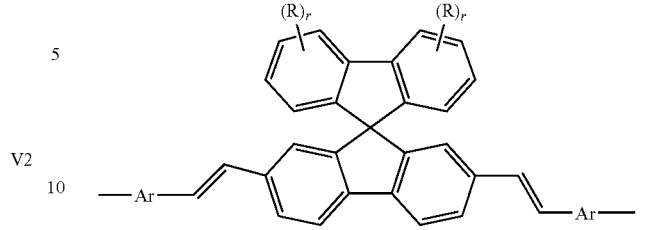

wherein R and r are as defined above, and Ar has one of the meanings of $Ar^6$ and is preferably 1,4-phenylene that is optionally substituted by one or more groups L as defined above.

Particularly preferred groups of formula VI are selected from the following subformulae:

VI1a

VI2a

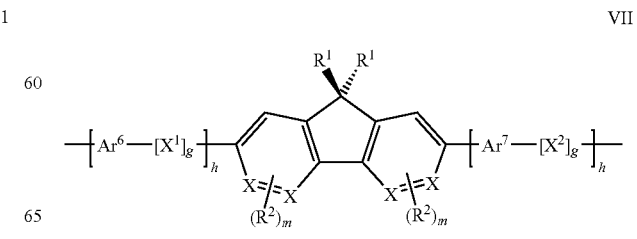

wherein r and L are as defined above, and L" is H or linear, branched or cyclic alkyl or alkoxy having 1 to 20 C atoms, or optionally substituted aryl having 5 to 30 C atoms, or —N(Ar)$_2$, wherein Ar has one of the meanings of $Ar^6$ as defined above.

The groups of formula VI1a wherein L" is —N(Ar)$_2$ are also suitable as hole transporting groups $A^h$.

The groups of formula VI2 and VI2a are also suitable as emissive groups $A^{em}$.

The total ratio of groups of formula VI in polymer 2 is preferably from 1 to 95%, very preferably from 5 to 60% and most preferably from 10 to 50 mol %.

Further preferred backbone groups B are those of formula VII (fluorene derivatives):

VII wherein $R^{1,2}$ have in each occurrence independently of one another one of the meanings given in formula I, and $Ar^{6,7}$, $X^{1,2}$, g and h are as defined in formula IV.

The groups of formula VII are preferably selected from the following subformulae, as disclosed for example in U.S. Pat. No. 5,962,631:

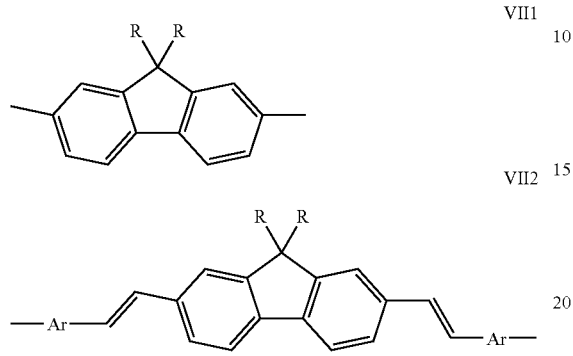

wherein R and r are as defined above, and Ar has one of the meanings of $Ar^6$ and is preferably 1,4-phenylene that is optionally substituted by one or more groups L as defined above.

Particularly preferred groups of formula VII are selected from the following subformulae:

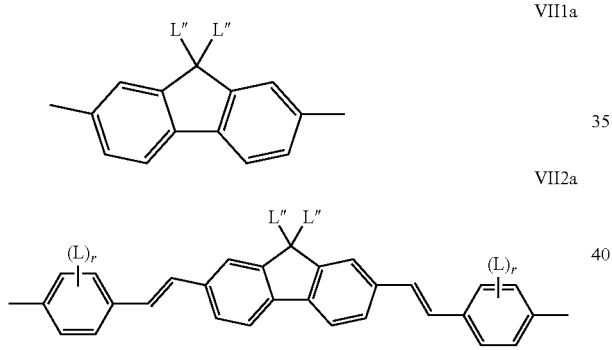

wherein r and L are as defined above, and L" is H or linear, branched or cyclic alkyl or alkoxy having 1 to 20 C atoms, or optionally substituted aryl having 5 to 30 C atoms, or —N(Ar)$_2$, wherein Ar has one of the meanings of $Ar^6$ as defined above.

The groups of formula VII2 and VII2a are also suitable as emissive groups $A^{em}$.

Further preferred backbone groups B are those selected from the following formulae:

Binaphthyl groups of formula VIII, as disclosed for example in WO 2006/063852 A1:

VIII

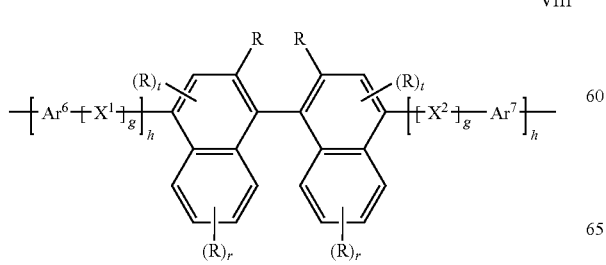

wherein R, $Ar^6$, $Ar^7$, $X^1$, $X^2$, r, g and h are as defined above, and t is 0 or 1.

Groups of formula IX, as disclosed for example in WO 2005/056633A1, EP1344788A1 and WO2007/043495A1:

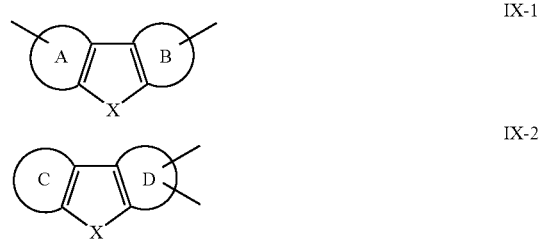

wherein ring A, ring B, ring C and ring D independently of each other represent an optionally substituted aromatic hydrocarbon ring; X represents —C($R^1R^2$)—, —O—, —S—, —S(=O)—, —S(=O)$_2$—, —Si($R^1R^2$)—, —B($R^1$)—, —P($R^1$)—, —P(=O)($R^1$)—, —O—C($R^1R^2$)—, or —N=C($R^1$)—. If X is —C($R^1R^2$)$_2$, then at least one of ring A and ring B, or at least one of ring C and ring D, is an aromatic hydrocarbon ring obtained by condensing a plurality of benzene rings; and $R^1$ and $R^2$ have one of the meanings given above, and may also together form a ring system. Ring A, ring B, ring C and ring D may have a substituent selected from the group consisting of an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, and imino group.

Preferred groups of formula IX are selected from the following subformulae:

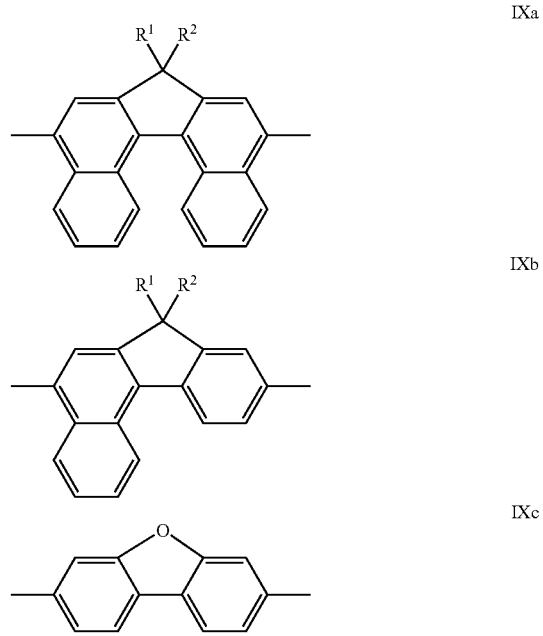

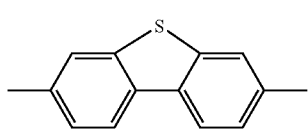

wherein $R^1$ and $R^2$ are as defined above,
Groups of the following formulae, as disclosed for example in WO 2005/033174 A1:

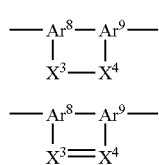

wherein
$Ar^8$ and $Ar^9$ independently of each other denote a trivalent aromatic hydrocarbon group or a trivalent heterocyclic group,
$X^3$ and $X^4$ independently of each other denote O, S, C(=O), S(=O), $SO_2$, $C(R^1)(R^2)$, $Si(R^1)(R^2)$, $N(R^1)$, $B(R^1)$, $P(R^1)$ or $P(=O)(R^1)$,
$X^5$ and $X^6$ independently of each other denote N, B, P, $C(R^1)$ or $Si(R^1)$,
$R^{1,2}$ are as defined above,
and wherein
$X^3$ and $Ar^9$ are bonded to adjacent carbon atoms in the aromatic ring of $Ar^9$,
$X^4$ and $Ar^8$ are bonded to adjacent carbon atoms in the aromatic ring of $Ar^9$,
$X^5$ and $Ar^9$ are bonded to adjacent atoms in the aromatic ring of $Ar^8$, and
$X^6$ and $Ar^8$ are bonded to adjacent atoms in the aromatic ring of $Ar^9$.
The groups of formula X are preferably of the following subformula:

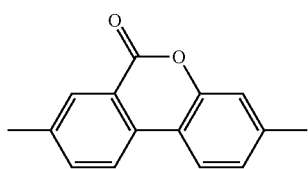

Groups of formula XII, as disclosed for example in WO2003/099901A1:

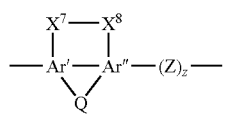

wherein
$Ar'$ and $Ar''$ denote an aromatic hydrocarbon group or heterocyclic group;
one of $X^7$ and $X^8$ denotes C(=O) or $C(R^1)(R^2)$ and the other denotes O, S, C(=O), S(=O), $SO_2$, $C(R^1)(R^2)$, $Si(R^1)(R^2)$, $N(R^1)$, $B(R^1)$, $P(R^1)$ or $P(=O)(R^1)$,
Q is $X^9$, $X^9$—$X^{10}$ or $X^{11}$=$X^{12}$,
$X^9$ and $X^{10}$ denote independently of each other O, S, C(=O), S(=O), $SO_2$, $C(R^1)(R^2)$, $Si(R^1)(R^2)$, $N(R^1)$, $B(R^1)$, $P(R^1)$ or $P(=O)(R^1)$,
$X^{11}$ and $X^{12}$ denote independently of each other N, B, P, $C(R^1)$ or $Si(R^1)$,
Z denotes —$CR^1$=$CR^2$— or —C≡C—,
z is 0 or 1,
$R^{1,2}$ are as defined above.
The groups of formula XII are preferably selected from the following subformulae:

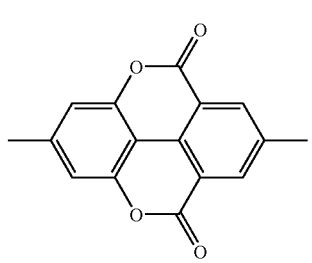

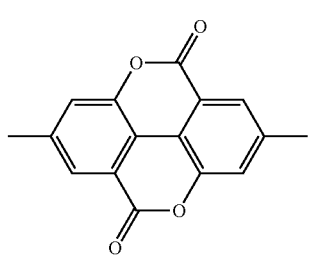

Groups of formula XIII, as disclosed for example in WO 2006/052457 A2 and WO 2006/118345A1:

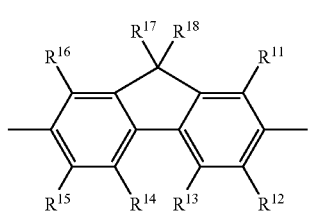

wherein
$R^{11}$-$R^{18}$ are independently of each other selected from the group consisting of H, halogen, alkyl, substituted alkyl, aryl, substituted aryl, heteroaryl, substituted heteroaryl, —CN, —CHO, —$COR^{20}$, —$CR^{20}$=$NR^{19}$, —$OR^{20}$, $SR^{20}$, —$SO_2R^{20}$, —$POR^{20}R^{19}$, —$PO_3R^2$, —$OCOR^{20}$, —$CO_2R^{20}$, —$NR^{20}R^{19}$, —N=$CR^{20}R^{19}$, —$NR^{20}COR^{19}$, and —$CONR^{20}R^{19}$; and any of $R^{11-18}$ do optionally form a ring system with adjacent repeating units in the polymer; and $R^{17}$ and $R^{18}$ do optionally together form a ring system;
$R^{19}$ and $R^{20}$ are independently of each other selected from the group consisting of H, alkyl, substituted alkyl, aryl, substituted aryl, heteroaryl, and substituted heteroaryl; and adjacent $R^{19,20}$ groups do optionally together form a ring system;
and wherein either
a) $R^{17}$ forms a ring system with $R^{16}$ or
b) $R^{17}$ forms a ring system with $R^{16}$, and $R^{18}$ forms a ring system with $R^{11}$, wherein the two ring systems do optionally share more than one atom.

The groups of formula XIII are preferably of the following subformula:

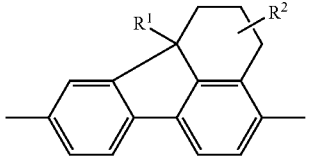

XIIIa wherein R¹ and R² are as defined above.

Groups of formula XIV, as disclosed for example in DE 102006003710.3:

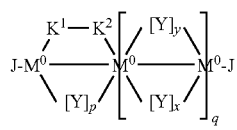

XIV wherein

M⁰ is in case of multiple occurrence independently of one another an aromatic, heteroaromatic or non-aromatic ring system having 2 to 40 C atoms, which is unsubstituted or substituted with one or more identical or different groups R¹, K$^{1,2}$ and Y are in case of multiple occurrence independently of one another a bridging group forming a cyclic system with M, selected from B(R¹), C(R¹)₂, Si(R¹)₂, C=O, C=S, C=Se, C=Te, C=NR¹, C=C(R¹)₂, O, S, S=O, SO₂, S(R¹)₂, N(R¹), P(R¹), P(=O)R¹, P(=S)R¹, C≡C or a combination or one, two, three or four of these groups, J is a linkage group to the polymer, and may also be a substituted oder unsubstituted C—C-double or triple bond, a substituted aromatic or heteroaromatic or non-aromatic cyclic ring system having 2 to 40 C atoms, which is unsubstituted or substituted with one or more identical or different groups R¹, R¹ is as defined in formula I, x, y, p are in case of multiple occurrence independently of one another 0 or 1, with the proviso that at least one of x and y is 1, q is an integer ≥1.

The groups of formula XIV are preferably selected from the following subformulae:

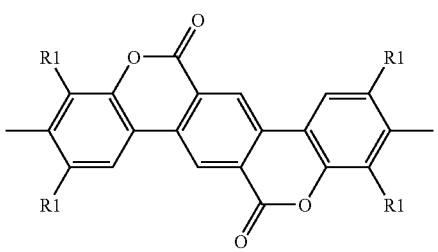

XIV1

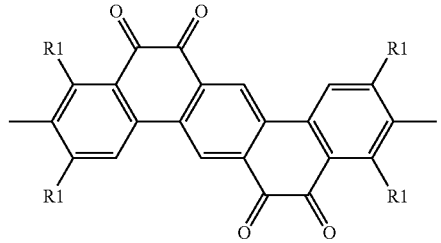

XIV2 wherein R¹ is defined as above.

Further preferred emissive groups $A^{em}$ are those selected from the following formulae:

Vinyltriarylamines of formula XV, as disclosed for example in DE 10 2005 060473.0:

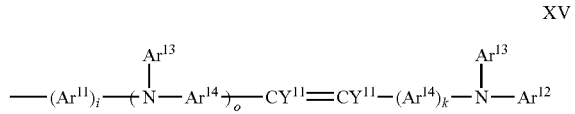

XV wherein

Ar¹¹ is in each occurrence independently of one another mono- or polycyclic aryl or heteroaryl, which is optionally substituted by one or more groups R²¹, Ar¹² is in each occurrence independently of one another mono- or polycyclic aryl or heteroaryl, which is optionally substituted by one or more groups R²², Ar¹³ is in each occurrence independently of one another mono- or polycyclic aryl or heteroaryl, which is optionally substituted by one or more groups R²³, Ar¹⁴ is in each occurrence independently of one another mono- or polycyclic aryl or heteroaryl, which is optionally substituted by one or more groups R²⁴, Y¹¹ is in case of multiple occurrence independently of one another selected from H, F, Cl or carbyl or hydrocarbyl with 1 to 40 C atoms that is optionally substituted and optionally comprises one or more hetero atoms, and optionally two groups Y¹¹, or a group Y¹¹ and an adjacent group R²¹, R²⁴, Ar¹¹ or Ar¹⁴, do together form an aromatic, mono- or polycyclic ring system, R$^{21-24}$ denote in case of multiple occurrence independently of one another H, halogen, —CN, —NC, —NCO, —NCS, —OCN, —SCN, —C(=O)NR⁰R⁰⁰, —C(=O)X⁰, —C(=O)R⁰, —NH₂, —NR⁰R⁰⁰, —SH, —SR⁰, —SO₃H, —SO₂R⁰, —OH, —NO₂, —CF₃, —SF₅, optionally substituted silyl, or carbyl or hydrocarbyl with 1 to 40 C atoms that is optionally substituted and optionally comprises one or more hetero atoms, and wherein optionally two or more groups R$^{21-24}$ do together form an aliphatic or aromatic, mono- or polycyclic ring system; and wherein R²¹, R²² and R²³ may also denote a covalent bond in a polymer, X⁰, R⁰ and R⁰⁰ are as defined in formula I, i is in each occurrence independently of one another 1, 2 or 3, k is in each occurrence independently of one another 1, 2 or 3, o is in each occurrence independently of one another 0 or 1.

The groups of formula XV are preferably selected from the following subformulae:
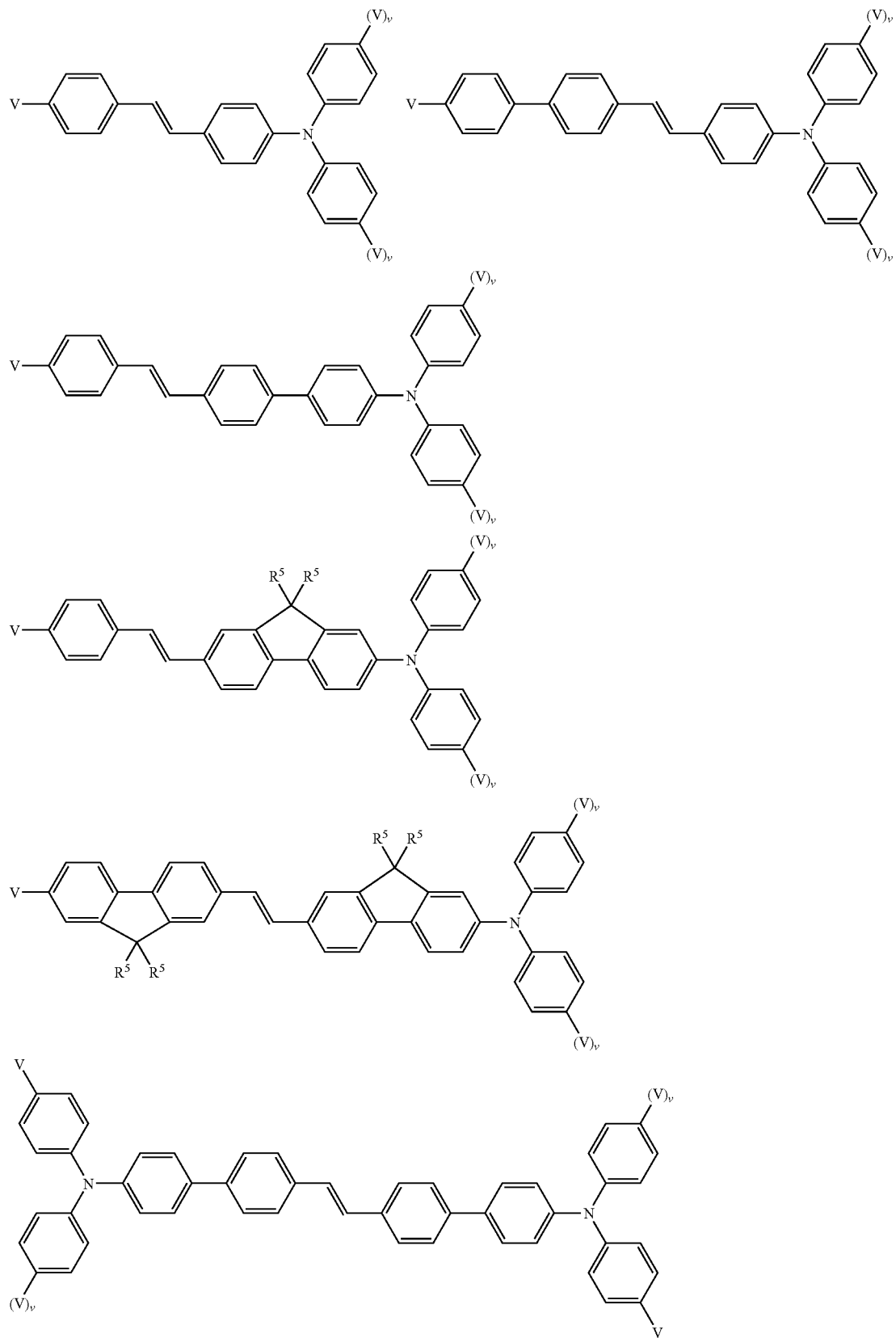

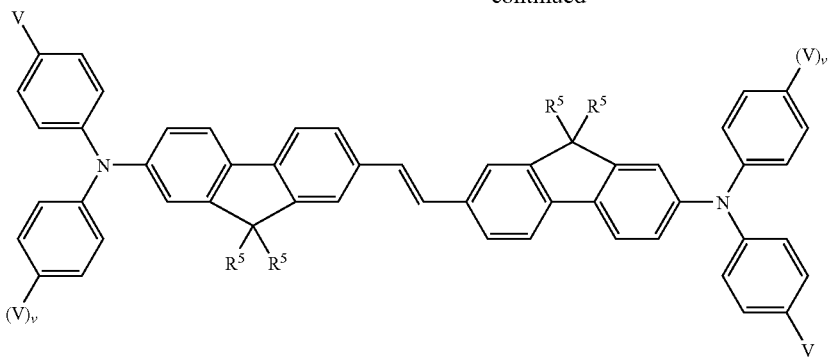
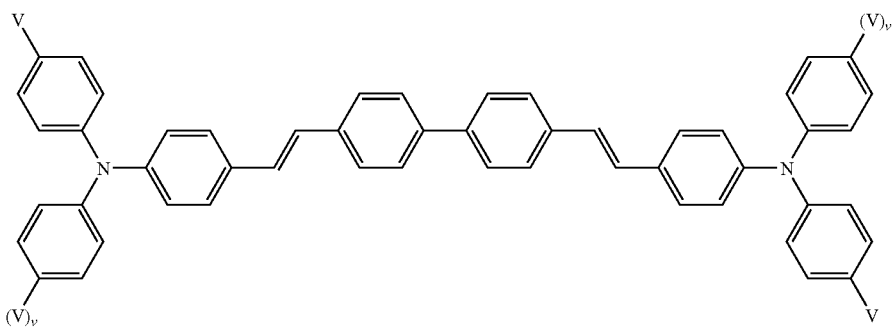
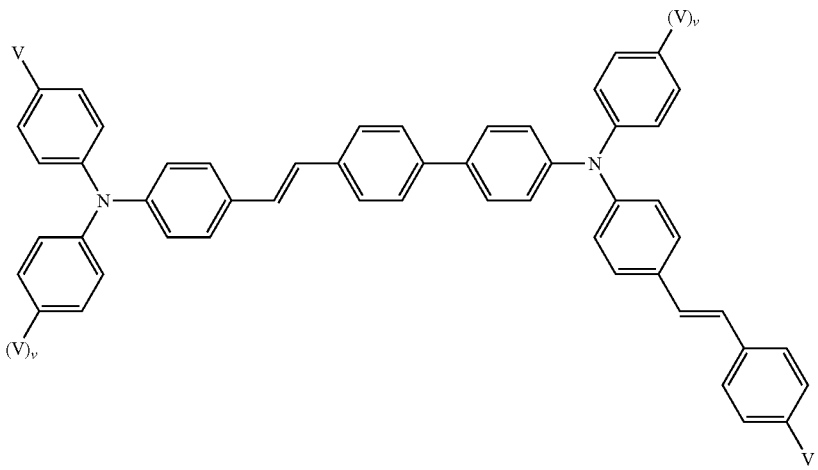
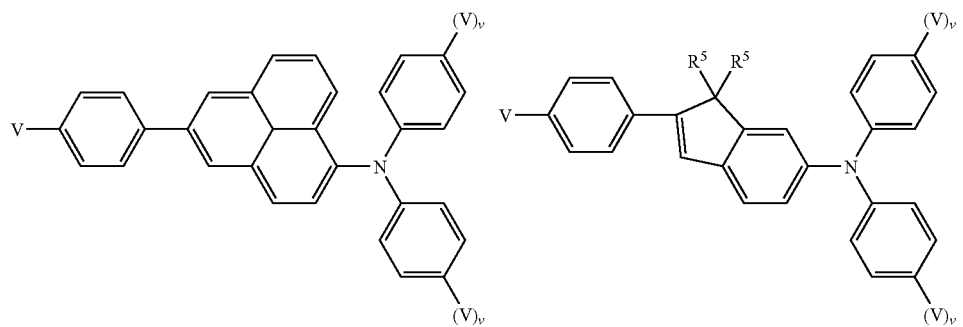

wherein V is a covalent bond in a polymer, v is 0 or 1, and R⁵ has one of the meanings of $R^{24}$ given above. The benzene rings are optionally substituted by one or more groups $R^5$.

The ratio of units of formula XV in polymer 2 is preferably from 0.1 to 10 mol %, very preferably from 0.5 to 5 mol % and most preferably from 1 to 2.5 mol %.

1,4-Bis(2-thienylvinyl)benzenes of formula XVI, as disclosed for example in WO 2005/030827:

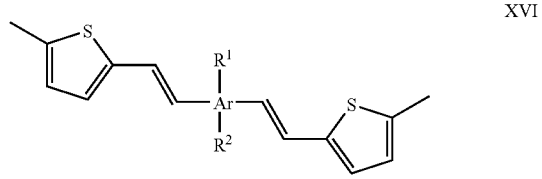

XVI wherein $R^1$ and $R^2$ are as defined in formula I and Ar has one of the meanings of $Ar^1$ given in formula II.

The groups of formula XVI are preferably of the following subformula:

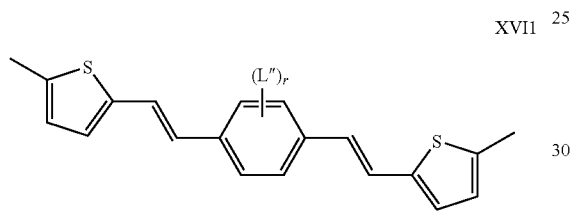

XVI1 wherein L" and r are as defined above, and L" is preferably alkyl, aryl, perfluoroalkyl, thioalkyl, cyano, alkoxy, heteroaryl, alkylaryl, or arylalkyl, very preferably H, phenyl, $C_{1-12}$-alkyl or -alkoxy.

Very preferred groups of formula XVI are of the following subformula:

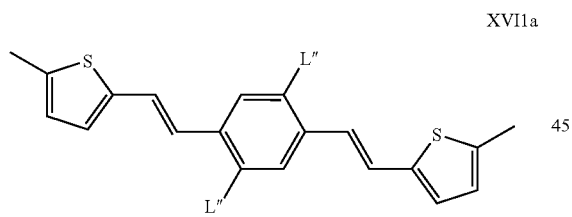

XVI1a wherein L" is preferably alkyl, aryl, perfluoroalkyl, thioalkyl, cyano, alkoxy, heteroaryl, alkylaryl, or arylalkyl, very preferably H, phenyl, $C_{1-12}$-alkyl or -alkoxy.

1,4-Bis(2-arylenvinyl)benzenes of formula XVII, as disclosed for example in WO 00/46321:

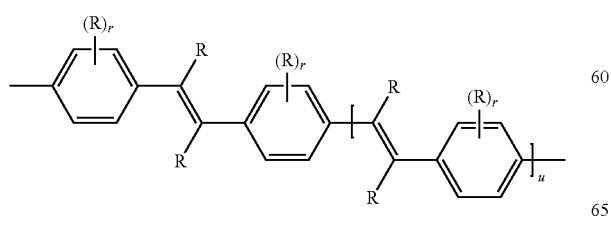

XVII wherein r and R are as defined above and u is 0 or 1.

The groups of formula XVII are preferably selected from the following subformulae:

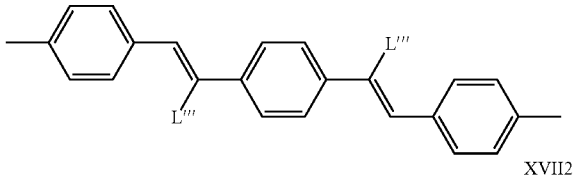

XVII1

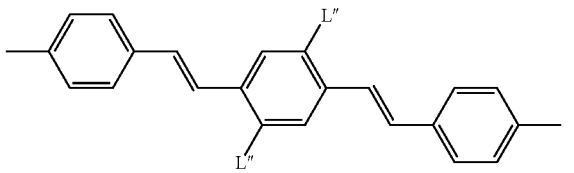

XVII2

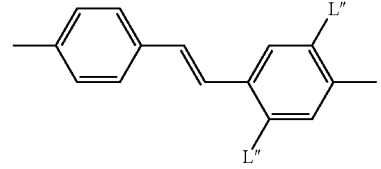

XVII3 wherein L" is preferably alkyl, aryl, perfluoroalkyl, thioalkyl, cyano, alkoxy, heteroaryl, alkylaryl, or arylalkyl, very preferably H, phenyl, $C_{1-12}$-alkyl or -alkoxy; and L'" is H, F, Cl, CN or optionally fluorinated linear, branched or cyclic alkyl having 1 to 20 C atoms, or optionally substituted aryl having 5 to 30 C atoms, preferably H or phenyl.

Groups of formula XVIII:

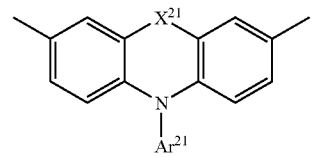

XVIII wherein $X^{21}$ is O, S, $SO_2C(R^x)_2$ or $N-R^x$ wherein $R^x$ is aryl or substituted aryl or aralkyl with 6 to 40 C atoms, or alkyl with 1 to 24 C atoms, preferably aryl with of 6 to 24 C atoms, very preferably alkylated aryl with 6 to 24 C atoms, $Ar^{21}$ is optionally substituted aryl or heteroaryl with 6 to 40, preferably 6 to 24, very preferably 6 to 14 C atoms.

Groups of the following formulae:

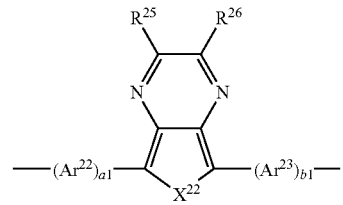

XIX

-continued

XX

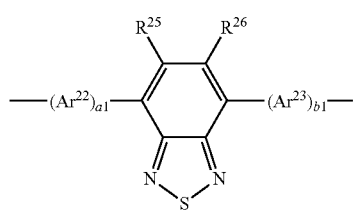

wherein
$X^{22}$ is $R^{27}C=CR^{27}$ or S, wherein preferably each $R^{27}$ is independently selected from hydrogen, alkyl, aryl, perfluoroalkyl, thioalkyl, cyano, alkoxy, heteroaryl, alkylaryl, or arylalkyl,
$R^{25}$ and $R^{26}$ are the same or different and are each a substituent group,
$Ar^{22}$ and $Ar^{23}$ are in case of multiple occurrence independently of one another a bivalent aromatic or heteroaromatic ring system having from 2 to 40 C atoms, which is optionally substituted by one or more groups $R^{25}$, and
a1 and b1 are in each occurrence independently of one another 0 or 1.

Groups of the following formulae:

XXIA

XXIB

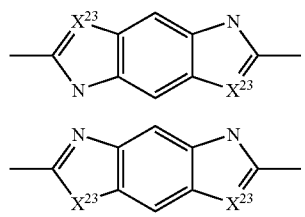

wherein $X^{23}$ is NH, O, or S.

Groups of the following formulae:

XXII

XXIII

XXIV

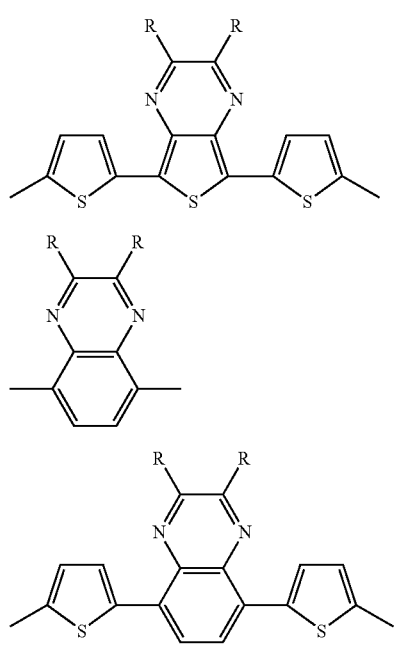

-continued

XXV

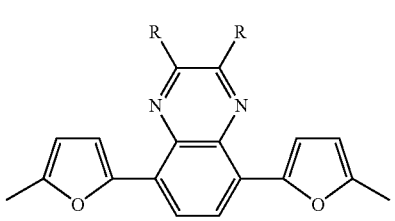

XXVI

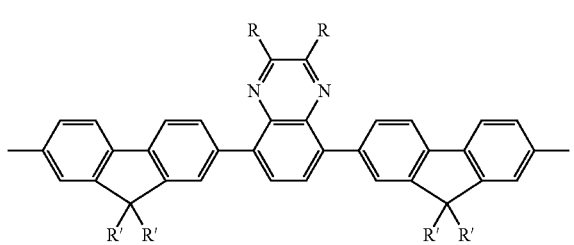

XXVII

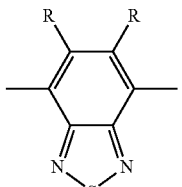

XXVIII

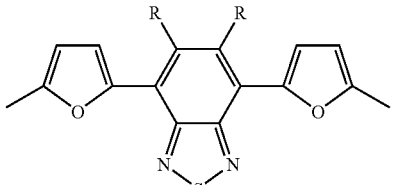

XXIX

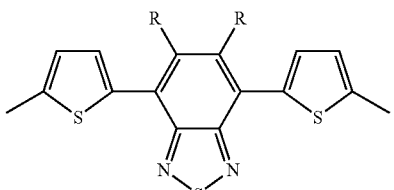

XXX

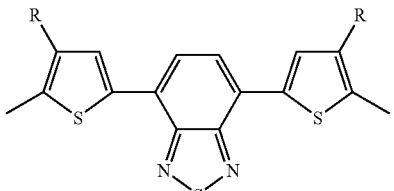

XXXI

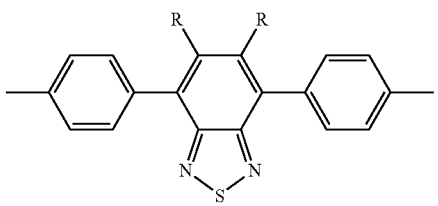

XXXII

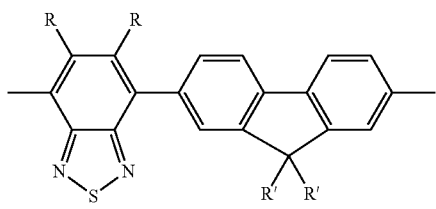

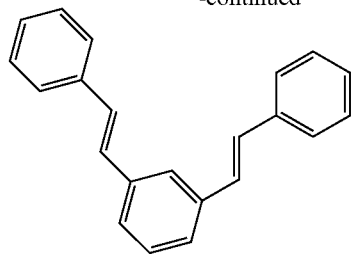

wherein R and R' are as defined above, and are in each occurrence independently of one another preferably H, alkyl, aryl, perfluoroalkyl, thioalkyl, cyano, alkoxy, heteroaryl, alkylaryl, or arylalkyl. R is preferably H, phenyl, or alkyl having 1, 2, 3, 4, 5 or 6 C atoms. R' is preferably n-octyl or n-octyloxy;

Groups selected from the following formulae:

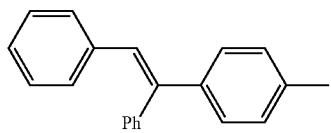

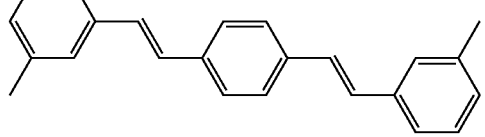

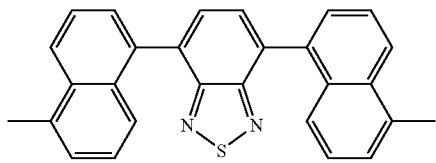

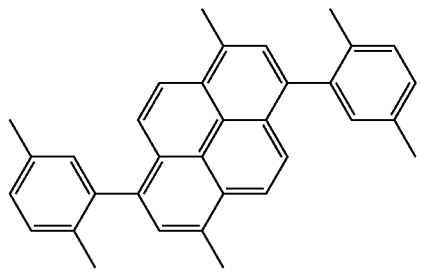

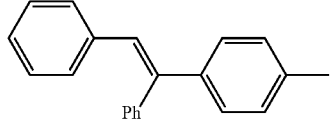

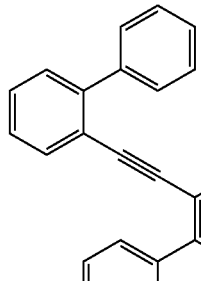

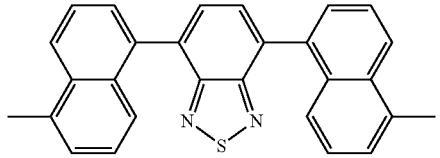

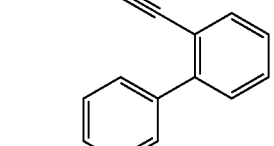

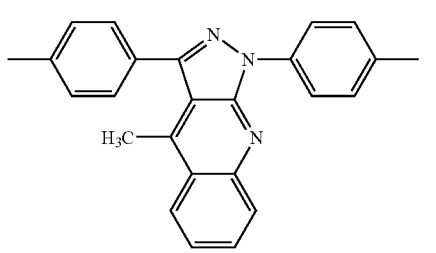

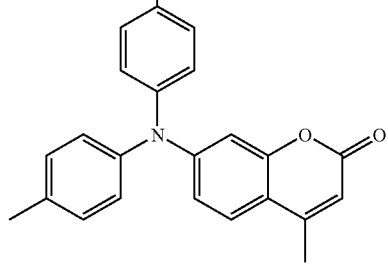

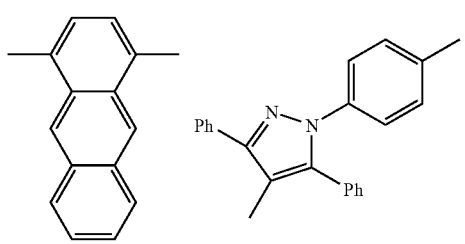

wherein Ph denotes phenyl;

Further suitable and preferred groups that can be used as exciton formation groups $A^{ex}$ or emissive groups $A^{em}$ are those selected from the following formulae:

wherein R' and R'' are as defined above;

Triarylamines of formula XXXIV comprising one or more heteroaromatic groups (as disclosed for example in WO 03/35714):

$$—Ar^{26}—Ar^{27}—N(Ar^{28})—Ar^{29}—Ar^{30}— \quad \text{XXXIV}$$

wherein $Ar^{26-30}$ have independently of each other one of the meanings of $Ar^1$ given above, and at least one of $Ar^{26-30}$ is optionally substituted heteroaryl, for example thiophene or triazine. Preferred groups of this type are the following:

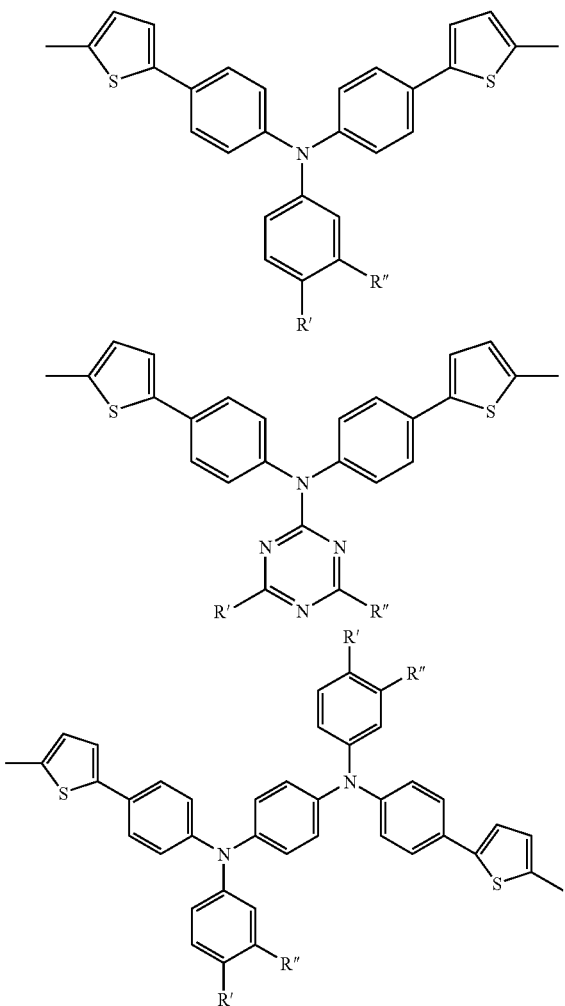

wherein R' and R" are as defined above and are preferably alkyl, perfluoroalkyl, alkylaryl, arylalkyl, heteroaryl, aryl, alkoxy, aryloxy or thioalkyl.

Further suitable and preferred backbone groups are those selected from the following formulae, as disclosed for example in WO2006/114364A1 and EP1345477A2:

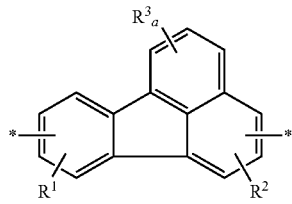

XXXXI

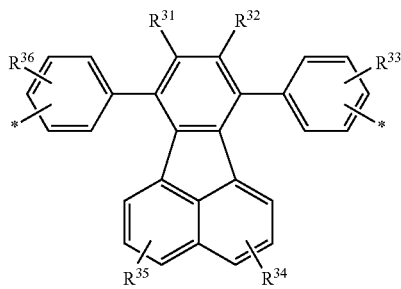

XXXXXII

Wherein $R^{31-36}$ are independently of each other selected from H, alkyl, aryloxy, an aromatic rest, a condensed aromatic ring system, a heteroaromatic rest, —CH═CH(E)- or (Z)—CH═CH—$C_6H_5$, acryloyl, methacryloyl, methylstyryl, —O—CH═$CH_2$, or glycidyl,

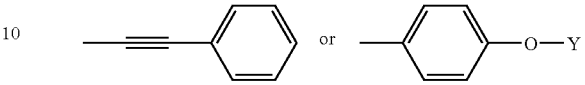

wherein Y represents acryloyl, methacryloyl, ortho-, or para-methylstyryl, —O—CH═$CH_2$ or glycidyl.

In a further preferred embodiment of the present invention polymer 2 comprises one or more identical or different emissive groups $A^{em}$ emitting light from the triplett state. Suitable groups of this type are known to the expert and are described in the literature. Especially preferred are groups based on or derived from metal complexes.

These groups are preferably selected of the formula $M(L)_z$, wherein M is a metal atom, L is in each occurrence independently of one another an organic ligand that is bonded to or coordinated with M via one, two or more positions, and z is an integer >1, preferably 1, 2, 3, 4, 5 or 6, and wherein these groups are linked to the polymer via one or more, preferably one, two or three positions, preferably via the ligands L.

M is a metal atom preferably selected from transition metals, especially those of group VIII, or lanthanoides, very preferably selected from Rh, Os, Ir, Pt, Au, Sm, Eu, Gd, Tb, Dy, Re, most preferably Os, Ir, Rh or Pt. M may also denote Al, Be or Zn.

L is preferably a mono- or bidentate organic ligand which can be neutral (non-ionic) or anionic. Such ligands are known in the art. Suitable neutral monodentate ligands are for example CO, isonitriles, amines, phosphines, phosphites, arsines, stilbines, or N-heterocycles like pyridine, pyridazine, pyrazine or triazine. Suitable anionic monodentate ligands are for example halogenides, cyanide, cyanates, isocyanates, thiocyanates, isothiocyanates, alcoholates, thioalcoholates, amides, carboxylates, or anionic N-heterocycles like pyrrolide, imidazolide, pyrazolide. Suitable bidentate ligands are for example diamines like ethylenediamine or its N-alkylated derivatives, imines, diimines, heterocycles with two N atoms like 2,2'-bipyridine or o-phenathroline, diphosphines, 1,3-diketonates derived from 1,3-diketones like acetylacetone, 3-ketonates derived from 3-keto esters, carboxylates derived from amino carboxylic acids like pyridine-2-carboxylic acid, quinoline-2-carboxylic acid, picolinic acid (pyridine-2-carboxylic) acid, salicyl iminates derived from salicyl imines, dialcoholates derived from dialcoholes like ethylene glycol or dithiolates derived from dithioles like 1,2-ethylene dithiolate. Further suitable ligands are selected from mono- or polycyclic aromatic or heteroaromatic groups having 4 to 50 C atoms, preferably containing at least one N atom, which are optionally substituted, like for example 8-quinolinol, benzoquinolinol, 2-phenyl pyridine, 2-phenyl benzothiazole, 2-phenyl-benzoxazole, porphyrine or their derivatives.

Suitable and preferred groups of this type are for example those of the following formulae (as disclosed for example in WO 02/68435):

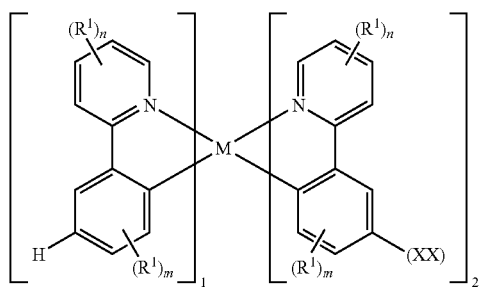
XXXV
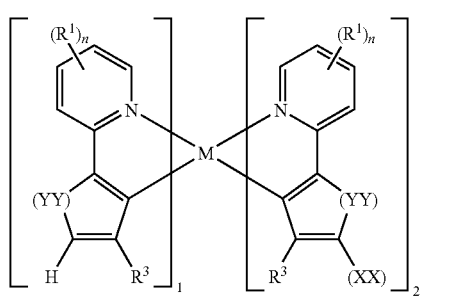
XXXVI
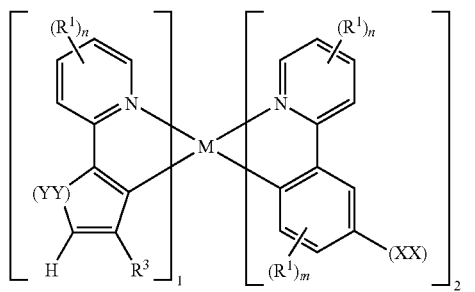
XXXVII
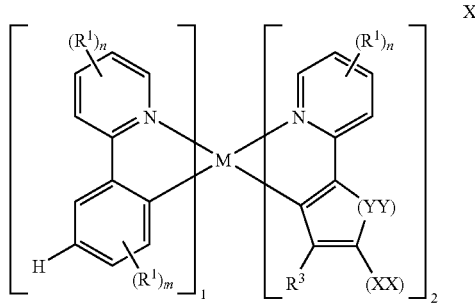
XXXVIII
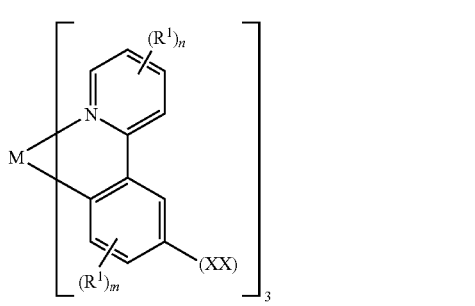
XXXIX
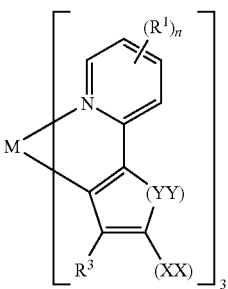
XXXX
wherein $R^1$, $R^3$, m and n are as defined above, M is a metal atom as defined above, preferably Rh or Ir, XX is a linkage in the polymer and YY is in each occurrence independently of one another O, S or Se.
Further suitable and preferred groups of this type are for example those as disclosed in U.S. Pat. No. 6,696,180 or US 2002/0193532 A1:
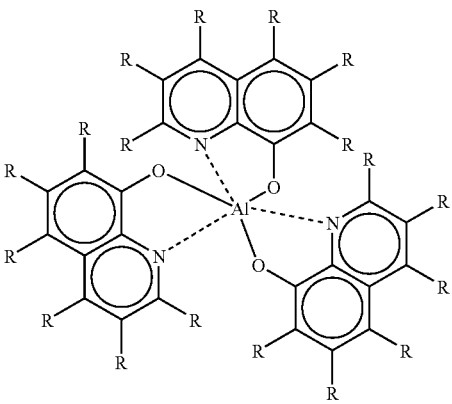
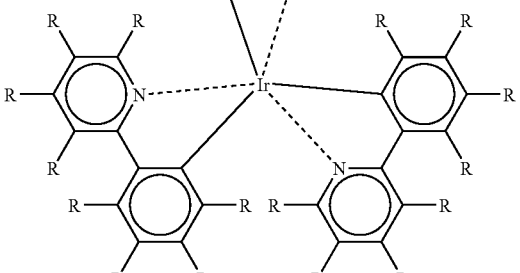

-continued
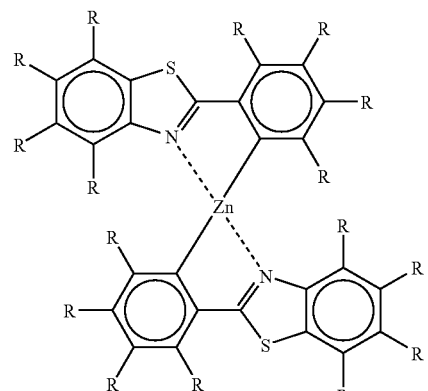
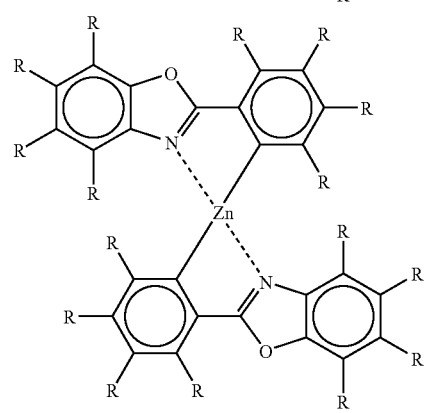
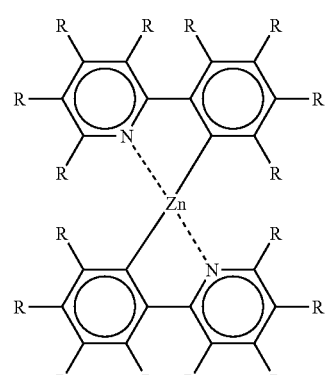
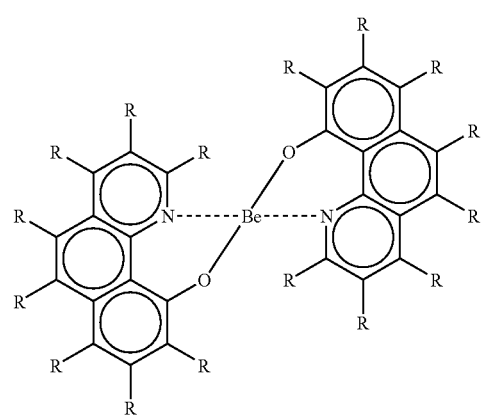
-continued
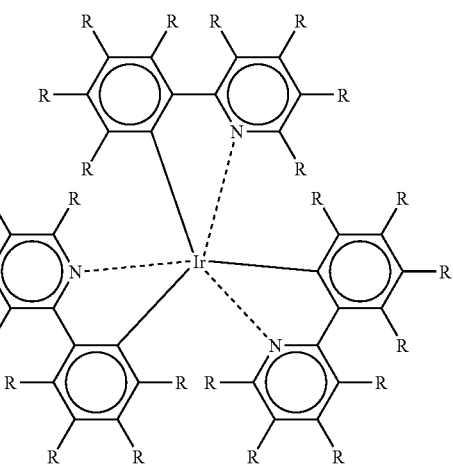
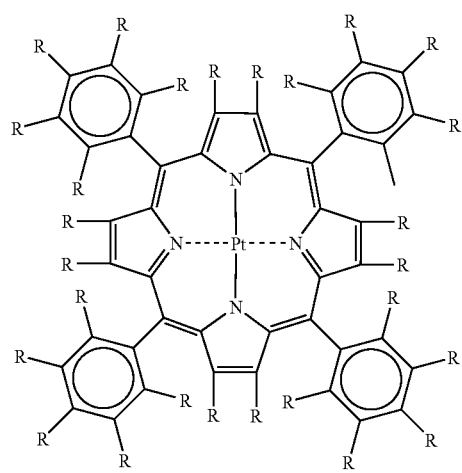
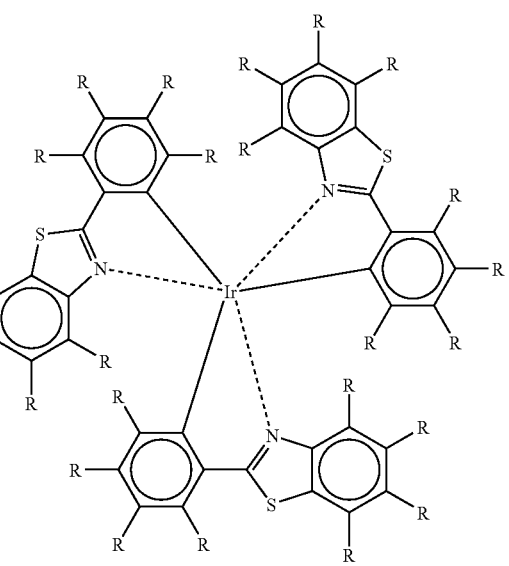

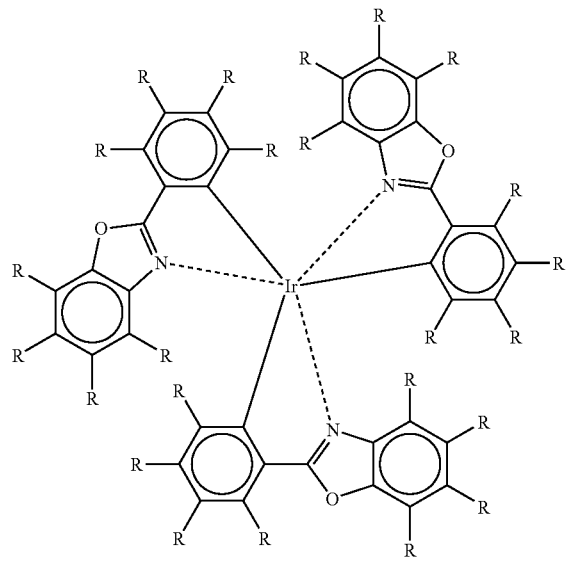
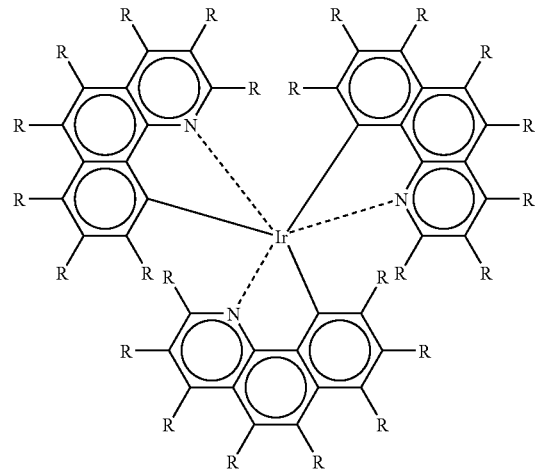
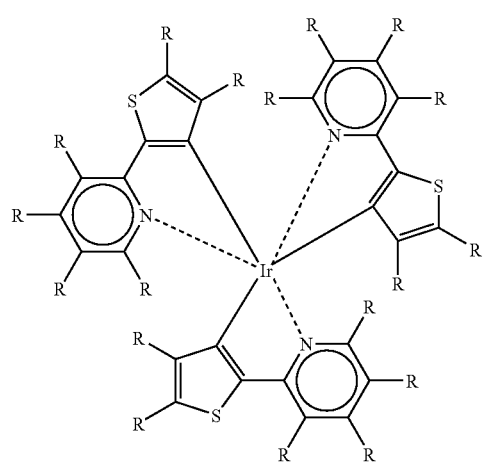
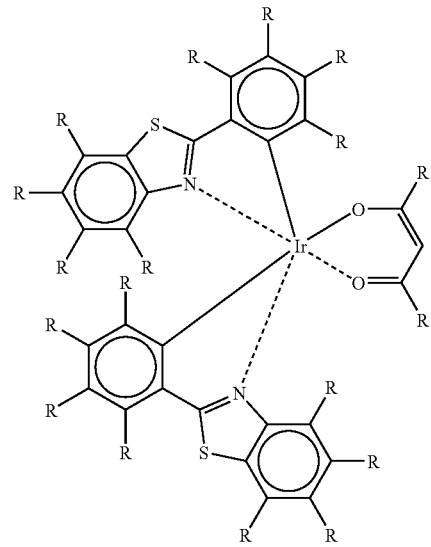
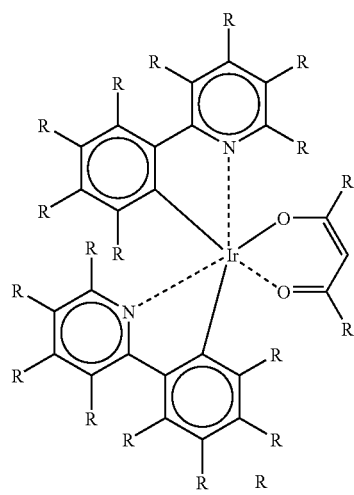
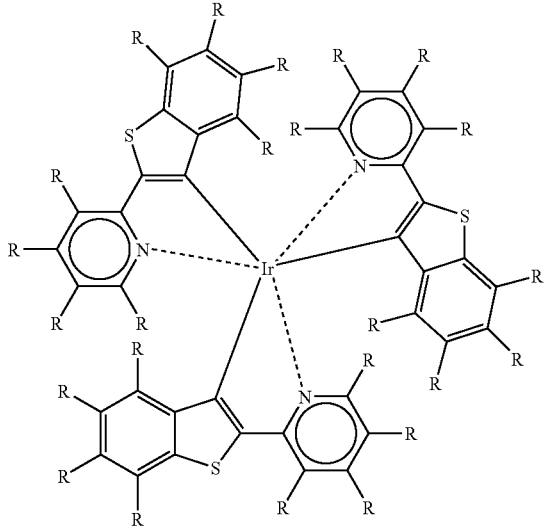

-continued
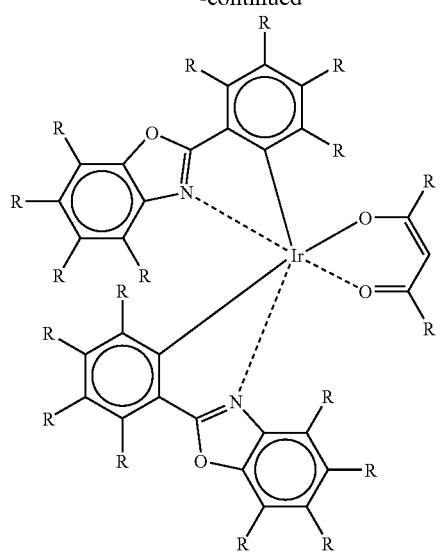
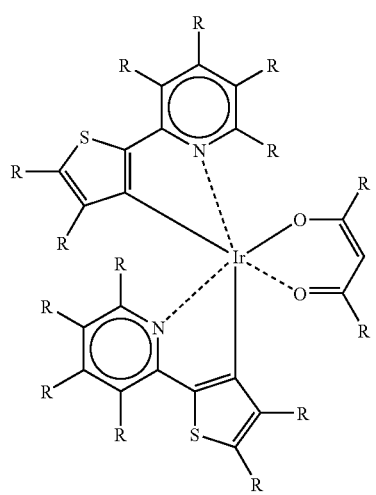
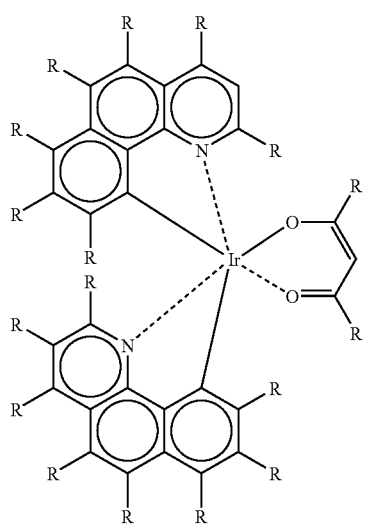
-continued
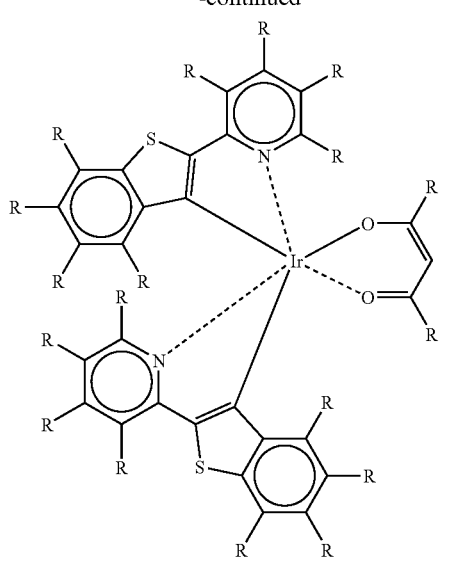
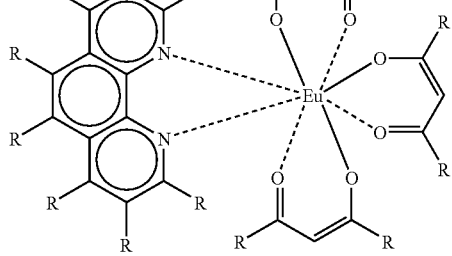
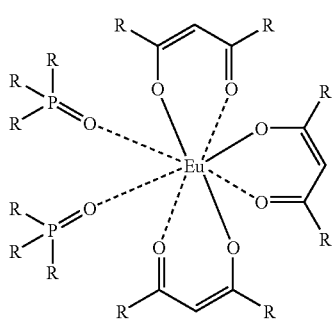
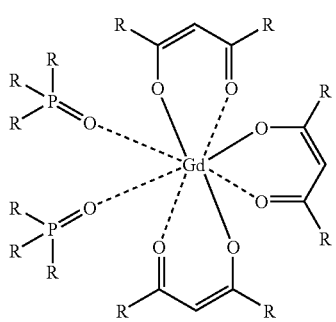

-continued

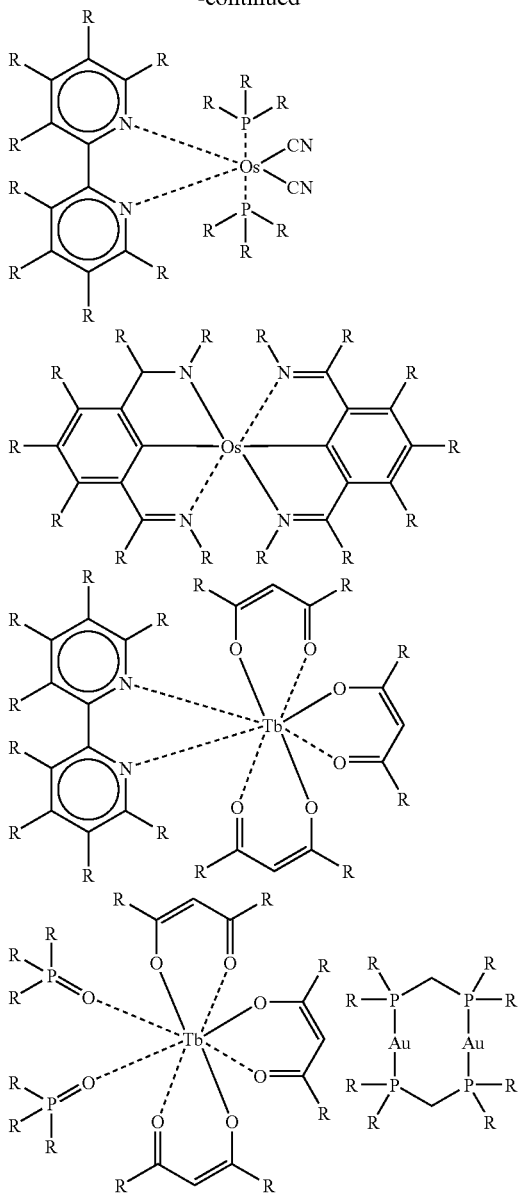

wherein R has one of the meanings of $R^1$ given above, and one or more, preferably one, two or three groups R, very preferably one group at one, two or three of the ligands, denotes a linkage to neighbouring units in the polymer.

Polymer 1 is preferably selected of the following formulae

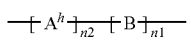 P11

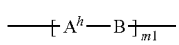 P12

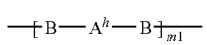 P13

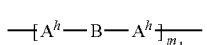 P14 wherein
$A^h$ is a hole transporting group as defined above,
B is a backbone group as defined above,
$m^1$ is an integer >1,
$0<n1<1$,
$0<n2<1$,
$n2<n1$, and
preferably $n1+n2=1$.

Preferably $A^h$ in formulae P11-14 is selected of formulae II and III, and B is selected of formulae I, IV, V, VI, VII, IX, X, XII, XIII and XIV.

Further preferably polymer 1 is a copolymer comprising one or more sections selected of formulae P11, P12, P13 and P14.

Polymer 2 is preferably selected of the following formulae

 P21

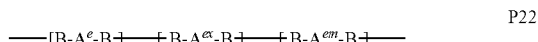 P22 wherein
$A^e$ is an electron transporting group as defined above,
$A^{ex}$ is an exciton formation group as defined above,
$A^{em}$ is an emissive group as defined above,
B is a backbone group as defined above,
$0<n1<1$,
$0<n2<1$,
$0<n3<1$,
$0\leq n4<1$,
preferably n1> each of n2, n3 and n4, and
preferably $n1+n2+n3+n4=1$.

$A^{ex}$ may additionally have emissive property. $A^{em}$ may additionally have exciton formation property. Preferably the groups $A^e$, $A^{ex}$, $A^{em}$ and B are selected from formulae I-XVII as indicated above.

In addition to the groups disclosed above, the polymers of the present invention may comprise one or more units which are typically used as backbone units or as blue emitters in light-emitting polymers. These are generally units which comprise at least one aromatic or otherwise conjugated group, but do not shift the emission wavelength into green or red. Preferred are aromatic groups having 4 to 40 C atoms (but also stilbene or tolane derivatives, and some bis(styrene) arylene derivatives) including, but not limited to, substituted or unsubstituted 1,4-phenylene, 1,4-naphthylene, 1,4- or 9,10-anthracenylene, 2,7- or 3,6-phenanthrenylene, 4,4'-biphenylene, 4,4''-terphenylene, 4,4'-bi-1,1'-naphthylene, 4,4'-stilbene, 4,5-dihydropyrene derivatives, 4,5,9,10-tetrahydropyrenes derivatives (e.g. as disclosed in EP 0 699 699), fluorene derivatives (e.g. as disclosed in EP 0 842 208, WO 99/54385, WO 00/22027, WO 00/22026, WO 00/46321), spirobifluorene derivatives (e.g. as disclosed in EP 0 707 020, EP 0 894 107, WO 03/020790, WO 02/077060) and 5,7-dihydrodibenzoxepine derivatives, furthermore so-called "Ladder-PPPs" (LPPP) (e.g. as disclosed in WO 92/18552), and PPPS containing ansa structures (e.g. as disclosed in EP 0 690 086).

In a further preferred embodiment of the present invention polymer 2 comprises one or more identical or different exciton formation units (dyes), which upon absorbing photons, for example from sun light, form excitons, which further dissociate by transferring holes to polymer 1 and electrons to the electron transporting unit in polymer 2. Preferred groups of this type are, perylene derivates as disclosed for example in Angew. Chem. Int. Ed. 2006, 45, 3364-3368, and Ruthenium dyes and their derivatives, as disclosed for example in Nature 1991, 353, pp 737 and Angew. Chem. Int. Ed. 2005, 44, 5740-5744.

The polymers of the present invention may be statistical or random copolymers, alternating or regioregular copolymers, block copolymers or combinations thereof. They may comprise two, three or more distinct monomer units.

The polymers of the present invention may be prepared by any suitable method. For example, they can be suitably prepared by aryl-aryl coupling reactions, such as Yamamoto coupling, Suzuki coupling, Stille coupling, Sonogashira coupling or Heck coupling. Suzuki coupling and Yamamoto coupling are especially preferred.

The monomers which are polymerised to form the repeat units of the polymers of the present invention can be prepared according to suitable methods which are known to the expert and have been disclosed in the literature. Suitable and preferred methods for the preparation of the indenofluorene monomers of formula I are described for example in WO 2004/041901. Suitable and preferred methods for the preparation of the triarylamine monomers of formula II are described for example in WO 99/54385. Suitable and preferred methods for the preparation of the phenanthrene monomers of formula IV are described for example in WO 2005/104264 A1. Suitable and preferred methods for the preparation of the vinyltriarylamine monomers of formula XV are described for example in DE102005060473.0.

Preferably the polymers are prepared from monomers comprising one of the above mentioned groups, which are linked to two polymerisable groups P. Accordingly, for example the monomers for the units of formula I1 are selected of the following formula

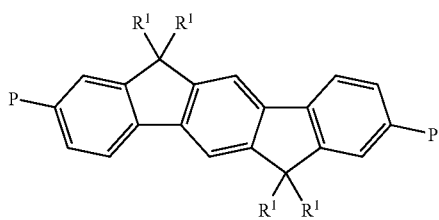

wherein P is a polymerisable group and $R^1$ is as defined above. The monomers for the units of the other formulae disclosed above are built accordingly.

Preferably the groups P are independently of each other selected from Cl, Br, I, O-tosylate, O-triflate, O-mesylate, O-nonaflate, $SiMe_{3-z}F_z$ (wherein z is 1 or 2), $O-SO_2Z$, $B(OZ^1)_2$, $-CZ^2=C(Z^2)_2$, $-C\equiv CH$ and $Sn(Z^3)_3$, wherein Z and $Z^{1-3}$ are selected from the group consisting of alkyl and aryl, each being optionally substituted, and two groups $Z^1$ may also form a cyclic group.

Preferred methods for polymerisation are Suzuki polymerisation, as described for example in WO 00/53656, Yamamoto polymerisation, as described in for example in T. Yamamoto et al., Progress in Polymer Science 1993, 17, 1153-1205 or in WO 2004/022626 A1, and Stille coupling. For example, when synthesizing a linear polymer by Yamamoto polymerisation, a monomer as described above having two reactive halide groups P is preferably used. When synthesizing a linear polymer by Suzuki polymerisation, preferably a monomer as described above is used wherein at least one reactive group P is a boron derivative group.

Suzuki polymerisation may be used to prepare regioregular, block and random copolymers. In particular, random copolymers may be prepared from the above monomers wherein one reactive group P is halogen and the other reactive group P is a boron derivative group. Alternatively, block copolymers or alternating copolymers, in particular AB-type copolymers, may be prepared from a first and a second of the above monomers wherein both reactive groups of the first monomer are boron and both reactive groups of the second monomer are halide. The synthesis of block copolymers is described in detail for example in WO 2005/014688 A2.

It is also possible to prepare e.g. an AB-type polymer from a single monomer unit having the structure P-AB-P.

Suzuki polymerisation employs a Pd(0) complex or a Pd(II) salt. Preferred Pd(0) complexes are those bearing at least one phosphine ligand such as $Pd(Ph_3P)_4$. Another preferred phosphine ligand is tris(ortho-tolyl)phosphine, i.e. $Pd(o-Tol)_4$. Preferred Pd(II) salts include palladium acetate, i.e. $Pd(OAc)_2$. Suzuki polymerisation is performed in the presence of a base, for example sodium carbonate, potassium phosphate or an organic base such as tetraethylammonium carbonate. Yamamoto polymerisation employs a Ni(0) complex, for example bis(1,5-cyclooctadienyl)nickel(0).

As alternatives to halogens as described above, leaving groups of formula $-O-SO_2Z$ can be used wherein Z is as described above. Particular examples of such leaving groups are tosylate, mesylate and triflate.

A further aspect of the present invention is an electronic or electrooptical device comprising one or more polymer blends as described above and below. A further aspect is the use of the polymer blends as described above and below in an electronic or electrooptical device. Especially preferred devices are PLEDs.

The device assembly typically consists of a substrate (like e.g. a glass sheet or a plastic foil), a first electrode, an interlayer comprising a conductive, doped polymer, a semiconductor layer according to the invention, and a second electrode. The device is patterned and provided with contacts according to the desired application and then sealed, in order to avoid contact with water and air which could drastically reduce its lifetime. It may also be preferred to use a conductive, electrically doped polymer as electrode, in which case the interlayer comprising the conductive polymer can be omitted. For use in OFETs and TFTs the device has to contain a further electrode (gate electrode) in addition to the first and second electrode (source and drain electrode). The gate electrode is separated from the organic semiconductor layer by an insulator layer comprising a dielectric material having a dielectric constant that is usually high (but in some cases may also be low). It may also be suitable that the device comprises one or more further layers depending on the desired application.

The electrodes are selected such their potential matches the potential of the adjacent organic layer, to ensure that hole or electrode injection is as efficient as possible. Preferred cathode materials are metals with low electronic work function, metal alloys or multilayered structures comprising different metals, such as alkaline earth metals, alkaline metals, main group metals or lanthanoides (e.g. Ca, Ba, Mg, Al, In, Mg, Yb, etc.). In case of multilayered structures it is also possible to use further metals in addition to the above-mentioned metals, which have a relatively high electronic work function, like e.g. Ag. In such cases normally combinations of metals are used, like e.g. Ca/Ag or Ba/Ag. It may also be preferred to apply a thin intermediate layer of a material with a high dielectric constant between the metallic cathode and the organic semiconductor. Useful materials for this purpose are e.g. alkaline or alkaline earth metal fluorides or oxides (e.g. LiF, $Li_2O$, $BaF_2$, MgO, NaF etc.). The thickness of this dielectric layer is preferably from 1 to 10 nm.

Preferred anode materials are those having a high electronic work function. Preferably the anode has a potential of more than 4.5 eV (vs. vacuum). Suitable materials for this purpose are metals having a high redox potential, like e.g. Ag, Pt or Au. It may also be preferred to use metal/metaloxide electrodes (e.g. $Al/Ni/NiO_x$, $Al/Pt/PtO_x$). For some applications at least one of the electrodes has to be transparent, in order to enable e.g. irradiation of the organic material (in OSCs) or decoupling of light (in OLEDs/PLEDs, O-LASERs). A preferred assembly comprises a transparent anode. Preferred anode materials for this purpose are conductive mixed metal oxides. Especially preferred are Indium Tin Oxide (ITO) or Indium Zinc Oxide (IZO). Further preferred are also conductive, doped organic materials, especially conductive doped polymers.

As charge injection layer on the anode a variety of doped conductive polymers can be used. Preferred polymers are those having a conductivity of $>10^{-8}$ S/cm. The potential of the layer is preferably 4 to 6 eV (vs. vacuum). The layer thickness is preferably from 10 to 500 nm, very preferably from 20 to 250 nm. Very preferably derivatives of polythiophene, like poly(3,4-ethylenedioxy-2,5-thiophene) (PEDOT) and polyaniline (PANI) are used. Doping is usually carried out with acids or oxidative agents. Preferably doping is carried out with polymeric or polymer bound Brönsted acids. Preferred materials for this purpose are polymeric sulfonic acids, especially polystyrene sulfonic acid, polyvinyl sulfonic acid and poly-(2-acrylamido-2-methyl-propane sulfonic acid) (PAMPSA). The conductive polymer is usually applied as an aqueous solution or dispersion and is insoluble in organic solvents, which allows to apply the subsequent layer from organic solution.

Typically, the blend is coated on a device structure which consists of ITO-coated glass which was covered by a layer of conductive polymer. The thickness of the conductive polymer can vary between 10 and 200 nm depending on ITO-roughness. The polymer blend is then coated from solution onto the conductive polymer in a thickness varying from 20 to 120 nm, preferably from 60 to 100 nm. Typically, the conductive polymer and the blend is baked after coating to remove rest of solvents (water and organic solvent) for a certain period of time. Baking temperatures vary from the polymers used and are typically in the range of 100-200° C. for 1-120 minutes, preferably 130-200° C. for 1-60 minutes and most preferably 150-180° C. for 10-30 minutes.

After coating the cathode on top of the blend, the device is typically covered by a lid to avoid penetration of moisture and oxygen.

In another embodiment of this invention the blend can also be coated onto an interlayer. In this case a polymer having hole transport property, which may be polymer 1 or a different polymer, is coated from organic solution onto the conductive polymer and the film is heated at elevated temperature to form an interlayer. Then, non-solidified residues of the interlayer are washed away with the organic solvent and the blend is coated directly onto the deposited interlayer. Alternatively, the blend can also be directly coating onto the interlayer. After coating the blend, a heating procedure as described above is applied again.

The electronic or electrooptical device can also be for example an organic field effect transistor (OFET), thin film transistor (TFT), organic solar cell (O-SC), organic laser diode (O-laser), organic integrated circuit (O-IC), radio frequency identification (RFID) tag, photodetector, sensor, logic circuit, memory element, capacitor, charge injection layer, Schottky diode, planarising layer, antistatic film, conducting substrate or pattern, photoconductor, electrophotographic element, or organic light emitting transistor (OLET).

Another aspect of the invention relates to a solution comprising one or more polymer blends as described above and below and one or more organic solvents.

Examples of suitable and preferred organic solvents include, without limitation, dichloromethane, trichloromethane, monochlorobenzene, o-dichlorobenzene, tetrahydrofuran, anisole, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, dimethylformamide, dimethylacetamide, dimethylsulfoxide, tetraline, decaline, indane, methyl benzoate, ethyl benzoate, mesitylene and/or mixtures thereof.

The concentration of the polymers in the solution is preferably 0.1 to 10% by weight, more preferably 0.5 to 5% by weight. Optionally, the solution also comprises one or more binders to adjust the rheological properties, as described in WO 2005/055248 A1.

After the appropriate mixing and ageing, solutions are evaluated as one of the following categories: complete solution, borderline solution or insoluble. The contour line is drawn to outline the solubility parameter-hydrogen bonding limits dividing solubility and insolubility. 'Complete' solvents falling within the solubility area can be chosen from literature values such as published in "Crowley, J. D., Teague, G. S. Jr and Lowe, J. W. Jr., Journal of Paint Technology, 38, No 496, 296 (1966)". Solvent blends may also be used and can be identified as described in "Solvents, W. H. Ellis, Federation of Societies for Coatings Technology, p 9-10, 1986". Such a procedure may lead to a blend of 'non' solvents that will dissolve both the polymers of the present invention, although it is desirable to have at least one true solvent in a blend.

It is desirable to generate small structures or patterns in modern microelectronics to reduce cost (more devices/unit area), and power consumption. Patterning of the layer of the invention may be carried out for example by photolithography or electron beam lithography.

For use as thin layers in electronic or electrooptical devices the polymer blends or solutions of the present invention may be deposited by any suitable method. Liquid coating of devices such OLEDs is more desirable than vacuum deposition techniques. Solution deposition methods are especially preferred. Preferred deposition techniques include, without limitation, dip coating, spin coating, ink jet printing, letterpress printing, screen printing, doctor blade coating, roller printing, reverse-roller printing, offset lithography printing, flexographic printing, web printing, spray coating, brush coating or pad printing. Ink-jet printing is particularly preferred as it allows high resolution displays to be prepared.

Selected solutions of the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used to apply the organic semiconductor layer to a substrate. Additionally semi-industrial heads such as those manufactured by Brother, Epson, Konica, Seiko Instruments Toshiba TEC or single nozzle microdispensers such as those produced by Microdrop and Microfab may be used.

In order to be applied by ink jet printing or microdispensing, the polymers should be first dissolved in a suitable solvent. Solvents must fulfil the requirements stated above and must not have any detrimental effect on the chosen print head. Additionally, solvents should have boiling points>100° C., preferably >140° C. and more preferably >150° C. in order to prevent operability problems caused by the solution drying out inside the print head. Apart from the solvents mentioned above, suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

A preferred solvent for depositing a polymer according to the present invention by ink jet printing comprises a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the polymer, which reduces or prevents clogging of the jets and separation of the components during spraying. The solvent(s) may include those selected from the following list of examples: dodecylbenzene, 1-methyl-4-tert-butylbenzene, terpineol limonene, isodurene, terpinolene, cymene, diethylbenzene. The solvent may be a solvent mixture, that is a combination of two or more solvents, each solvent preferably having a boiling point >100° C., more preferably >140° C. Such solvent(s) also enhance film formation in the layer deposited and reduce defects in the layer.

The ink jet fluid (that is mixture of solvent, binder and semiconducting compound) preferably has a viscosity at 20° C. of 1-100 mPa·s, more preferably 1-50 mPa·s and most preferably 1-30 mPa·s.

The polymers or solutions according to the present invention can additionally comprise one or more further components like for example surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, or inhibitors.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

The invention will now be described in more detail by reference to the following examples, which are illustrative only and do not limit the scope of the invention.

Unless stated otherwise, all specific values of physical parameters like efficiency, VIL curves and lifetime, as given above and below refer to a temperature of 25° C. (+/−1° C.). Ratios of monomers or repeating units in polymers are given in mol %. Ratios of polymers in polymer blends are given in weight %. The molecular weight of polymers is given as weight average molecular weight $M_w$ (GPC, polystyrene standard).

Example 1

Polymers

The following polymers are synthesized by Suzuki coupling as disclosed in WO03/048225.

Polymer1 is the copolymer of following monomers:

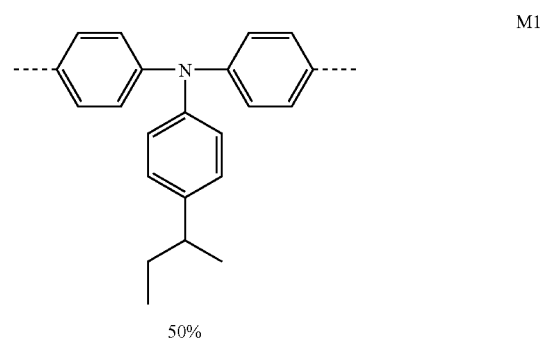

M1

50%

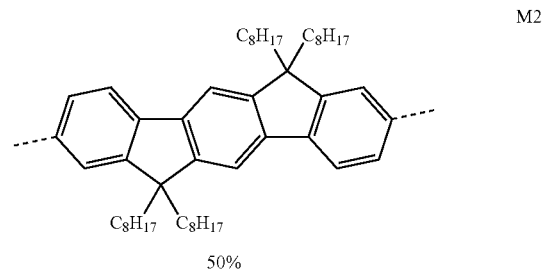

M2

50%

Polymer2a is the copolymer of following monomers:
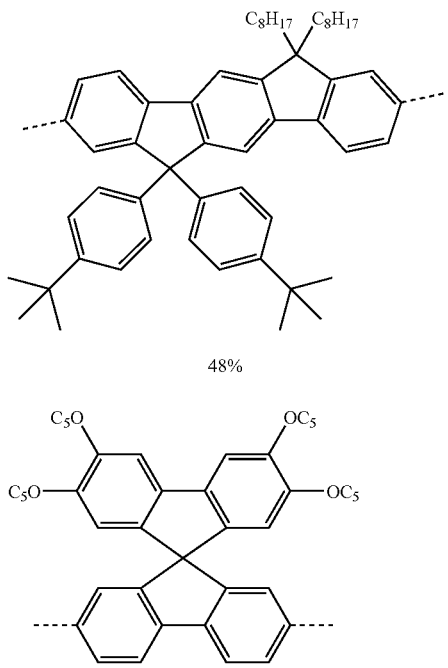
M3 48%
M4 50%
M5 2%
Polymer2b is the copolymer of following monomers:
M3 48%
-continued
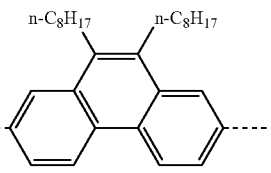
M6 50%
M5 2%
Polymer2c is the copolymer of following monomers:
M3 46%
M6 50%
M5 2%

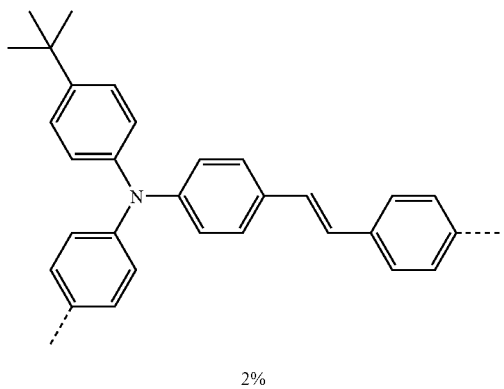

2%

Polymer2d is the copolymer of following monomers:

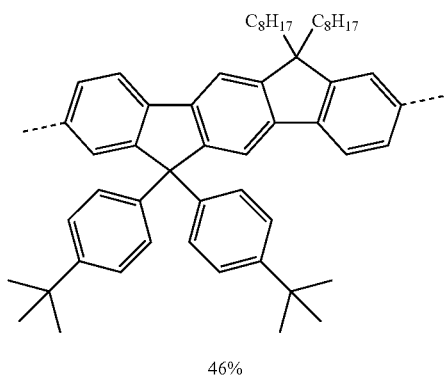

46%

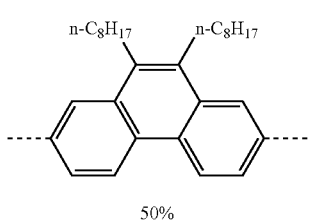

50%

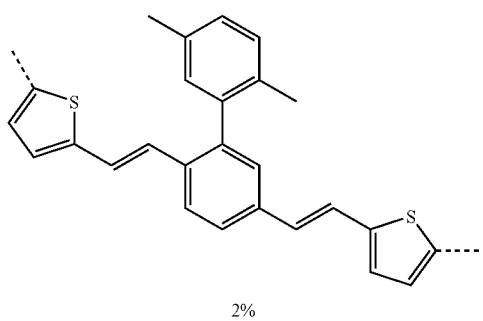

2%

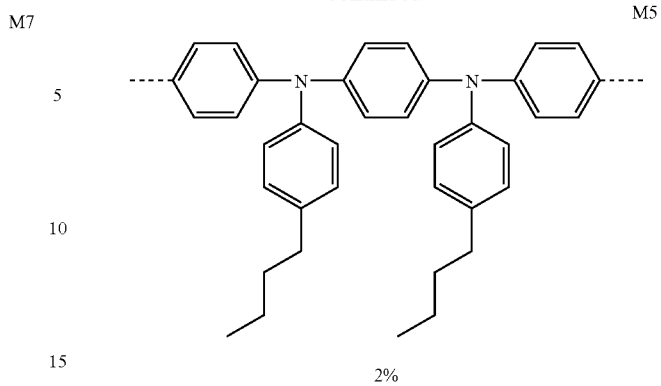

2%

Example 2

Cyclovoltammetry Measurement on the Polymers

The HOMO levels of the above polymers are measured by cyclovoltammetry (CV). The CV measurements are conducted in dichlormethane solution using tetrabutylammonium chloride as conducting salt, Ag/AgCl/KCl (3 mol/l) as reference electrode, Au as working electrode and Pt as counter electrode. FIG. 1, FIG. 2, FIG. 3 and FIG. 4 are the CV curves for poylmer1, polymer2a, polymer2c and polymer2d. 3 cycles were measured for every polymer. The HOMO levels were calculated by the average voltage of the local maximum peak in oxidation-curve and corresponding local minimum peak reduction-curve. Care should be taken to find the correct local minima and maxima, for example change the axis case to find all peaks. The results are summarised in Table 1, with the alignments of the different function groups to the corresponding peaks.

For polymer1, polymer2a and polymer2c, all peaks are very clearly spotted. All there cycles give essentially the same results. For polymer2d, the peak 2 is not very clearly to seen. This is due to the very strong oxidation and reduction for the neighbour peak 3. However, according to the shoulder in oxidation curve (see also the area marked with the dashed ellipse), an estimation could still be made for peak 2. Therefore, very reliable HOMO levels are obtained by CV measurement.

| | CV HOMO [eV] | Corresponding Group in polymer | Function of the group |
|---|---|---|---|
| | | Polymer1 | |
| Peak 1 | −5.14 | M2-M1-M2 | Hole transporting unit |
| | | Polymer2a | |
| Peak 1 | −4.84 | M4-M5-M4 | Exciton formation unit |
| Peak 2 | −5.15 | M4-M3-M4 | Electron transporting unit |
| | | Polymer2c | |
| Peak 1 | −4.87 | M6-M5-M6 | Exciton formation unit |
| Peak 2 | −5.18 | M6-M7-M6 | Emissive units |
| Peak 3 | −5.58 | M6-M3-M6 | Electron transport unit |
| | | Polymer2d | |
| Peak 1 | −4.85 | M6-M5-M6 | Exciton formation unit |
| Peak 2 | −5.29 | M6-M8-M6 | Emissive unit |
| Peak 3 | −5.59 | M6-M3-M6 | Electron transport unit |

Example 3

Quantum Simulation on Energy Levels of the Polymers

As mentioned before, the applicants established a very reliable quantum simulation method to determine the energy levels of organic materials. The HOMO and LUMO levels of individual units are calculated by Gaussian 03W using the DFT method. In the calculation, the trimer M2-M1-M2 is taken as hole transport unit in polymer1; M4-M3-M4 as electron transport unit and M4-M5-M4 as both exciton formation and emissive unit in polymer2a; M6-M3-M6 as electron transport unit and M6-M5-M6 as both exciton formation and emissive unit in polymer2b; M6-M3-M6 as electron transport unit, M6-M5-M6 as exciton formation unit and M6-M7-M6 as emissive unit in polymer2c; M6-M3-M6 as electron transport unit, M6-M5-M6 as exciton formation unit and M6-M8-M6 as emissive unit in polymer2d.

The CV measured and DFT calculated energy levels for the different function units in the polymers are shown in Table 2. It should be pointed out that the LUMO values calculated by DFT are less precise than the HOMO values. Therefore the LUMO values listed in Table 1 should be taken as indicative rather than quantitative, but still confirm the claimed properties.

TABLE 2

| Calculated trimer by DFT | Corresponding unit in polymer | HOMO Calibrated [eV] | LUMO Calibrated [eV] | HOMO measured by CV [eV] |
|---|---|---|---|---|
| M2-M1-M2 | Hole transport unit in polymer1 | −5.14 | −2.47 | −5.14 |
| M4-M3-M4 | Electron transport units in polymer2a | −5.19 | −2.55 | −5.15 |
| M6-M3-M6 | Electron transport units in polymer2b, 2c, 2d | −5.55 | −2.58 | −5.58[1] |
| M4-M5-M4 | Exciton formation unit in polymer2a | −4.89 | −2.29 | −4.84 |
| M6-M5-M6 | Exciton formation unit in polymer2b, 2c, 2d | −4.93 | −2.29 | −4.86[1] |
| M6-M7-M6 | Emissive units in polymer2c | −5.17 | −2.57 | −5.18 |
| M6-M8-M6 | Emissive units in polymer2d | −5.27 | −2.88 | −5.29 |

[1] Average of polymer2c and polymer2d

The CV measurement on the electron transport units of polymer2a and polymer2b-d is performed on polymers with 50% M4/50% M3 and 50% M6/50% M3. The HOMO of exciton formation unit in polymer2b-d is measured on a polymer of 50% M6/40% M3/10% M5. CV measurements on emissive units have not been performed. As can be seen in Table 2, the calculation on HOMO level agrees with the measurement very well. Therefore, the established simulation method can be used as a reliable tool for designing the material system according to the present invention. Later on, polymer1 will be used as interlayer polymer and hole transporting component in blends, and polymer2a-2d will be used as emissive and electron transporting component in blends. It should be pointed out that the HOMO of the electron transport unit of polymer2a is just 0.01 eV by CV and 0.05 eV by DFT lower than the HOMO of the hole transport unit of polymer1. In contrast, the HOMO of the electron transport unit of polymer2b-2d is about 0.41 eV by DFT and 0.44 eV by CV lower than the HOMO of the hole transport unit of polymer1. This difference is essential for the different performance of the blend systems.

Thus, a blend of polymer 1 with either of polymers 2b, 2c or 2d represents a blend according to the present invention. In contrast, a blend of polymer 1 with polymer 2a is not a blend according to the present invention and will be used for comparison purposes as described below.

Example 4

Device Preparation

PLED devices with an interlayer are prepared according to the following procedure:
1) Depositing 80 nm PEDOT (Baytron P A14083) onto indium tin oxide coated glass substrate by spin coating.
2) Depositing 20 nm polymer1 by spin coating from toluene solution having a concentration of 5% wt/l.
3) Heating the device at 180° C. for 1 hour.
4) Depositing the emissive layer by spin-coating from toluene solution to a thickness of around from 60 to 80 nm.
5) Depositing by evaporation over the emissive layer a cathode Ba/Al
6) Encapsulation of the device.

For a device without interlayer the steps 2 and 3 are omitted.

Example 5 (Comparison Example)

Light Emitting Diodes Using Blends of Polymer1 and Polymer2a as Emissive Layer Blends of 5%, 10% and 15 weight % polymer1, respectively, with polymer2a are tested as emissive layer (80 nm thickness) in a PLED device without interlayer. The reference is a device using polymer1 as interlayer and pure polymer2a as emissive layer (80 nm thickness). Table 3 shows the comparison of the performance of these devices.

TABLE 3

| Con. Polymer1 in blends | Max. Eff. [cd/A] | Uon [V] | U @ 100 Cd/m² [V] | CIE @ 100 cd/m² | Lifetime [hrs @ nits] | |
|---|---|---|---|---|---|---|
| Reference | 3.44 | 2.97 | 4.11 | 0.16/0.22 | 443 | 400 |
| 2% Polymer1 | 2.36 | 3.38 | 5.26 | 0.18/0.31 | 66.4 | 400 |
| 5% Polymer1 | 2.00 | 4.1 | 5.1 | 0.17/0.27 | 81 | 400 |
| 10% Polymer1 | 2.49 | 3.7 | 4.6 | 0.16/0.24 | 159 | 400 |
| 15% Polymer1 | 2.59 | 4.1 | 5.1 | 0.17/0.25 | 170 | 400 |

Figure 5:
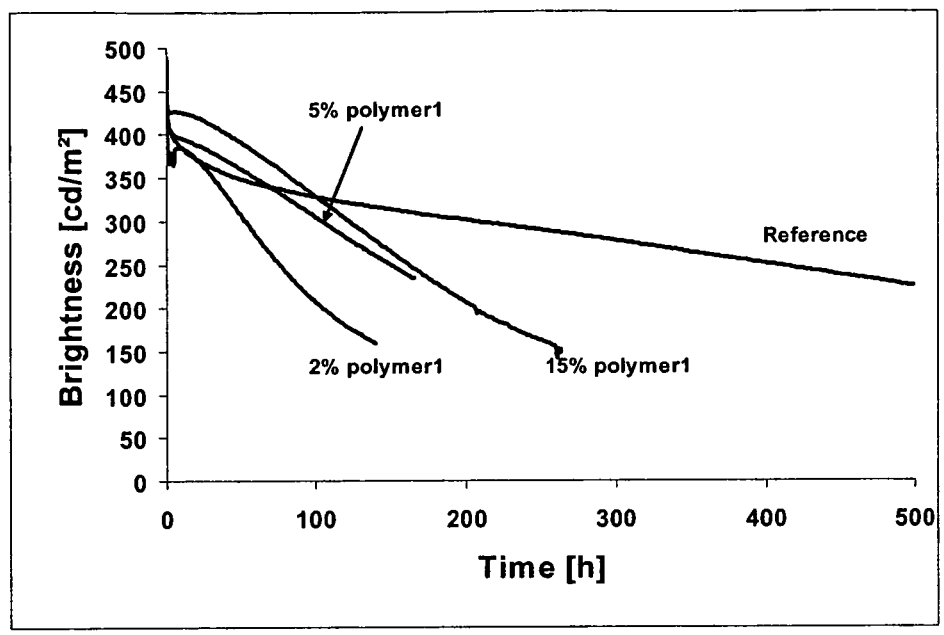

FIG. 5 shows the lifetime curves of the PLEDs using blends of polymer1 and polymer2a, in comparison with the reference. It can be seen that no blend PLED can give a comparable performance as the reference, and that the decay behaviors of the blend PLEDs are very different than that of the reference.

This shows that if the HOMO gap between the hole transporting unit of the first polymer and the electron transporting unit of the second polymer is too small, no working blend system with satisfactory performance can be obtained.

Example 6

Light Emitting Diodes Using Blends of Polymer1 and Polymer2b as Emissive Layer Blend of 15 weight % polymer1 with polymer2b was tested as emissive layer in a PLED device without an interlayer. The reference is a device using polymer1 as interlayer and pure polymer2b 65 nm thick as emissive layer.

Table 4 shows the summary of the performance of PLEDs using blend of 15 wt % polymer1 and polymer2b, where EQE stands for external quantum efficiency.

TABLE 4

|  | Max. Eff. [cd/A] | Uon [V] | U(100) [V] | CIE @ 100 cd/m² | EQE @ Max. Eff. | LT DC [hrs @ nits] | |
|---|---|---|---|---|---|---|---|
| Reference | 4.78 | 3.4 | 5.7 | 0.15/0.16 | 3.76% | 107 | 1000 |
| 15% polymer1 | 3.72 | 3.3 | 5.9 | 0.15/0.16 | 2.91% | 90 | 1000 |

Figure 6:
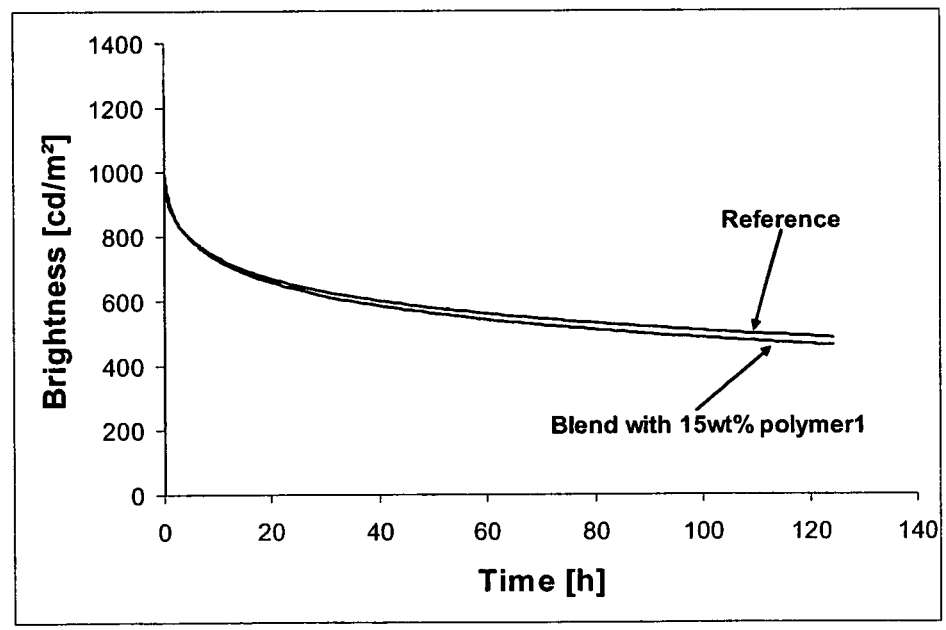
FIG. 6 depicts a comparison of the lifetime curves of the PLEDs listed in Table 4.

In FIG. 6, the lifetime curves are compared. The PLED using blend as emissive layer without the additional interlayer shows a comparable lifetime to the reference, though the efficiency is a little bit lower.

Example 7

Light Emitting Diodes Using Blends of Polymer1 and Polymer2c as Emissive Layer

Blends of 2%, 10%, 5% and 20 weight % polymer1, respectively, with polymer2c are tested as emissive layer in a PLED device without an interlayer. The reference is a device using polymer1 as interlayer and pure polymer2a 65 nm thick as emissive layer.

Table 5 shows the summary of the performance of PLEDs using blends of polymer1 and polymer2c in different concentration, where EQE stands for external quantum efficiency.

TABLE 5

| Con. polymer1 in blends | Thickness of emissive layer | Max. Eff. [cd/A] | Uon [V] | U(100) [V] | CIE @ 100 cd/m² | EQE @ Max. Eff. | LT DC [hrs @ nits] | |
|---|---|---|---|---|---|---|---|---|
| Reference | 65 nm | 5.92 | 3.4 | 5.7 | 0.15/0.17 | 4.41% | 304 | 1001 |
| 0% polymer1 | 65 nm | 4.15 | 3.7 | 6.5 | 0.15/0.18 | 2.96% | 14 | 999 |
| 2% polymer1 | 65 nm | 5.10 | 3.5 | 6.1 | 0.15/0.17 | 3.75% | 25 | 1000 |
| 10% polymer1 | 65 nm | 4.95 | 3.1 | 5.2 | 0.15/0.16 | 3.83% | 133 | 1000 |
| 15% polymer1 | 65 nm | 4.14 | 3.2 | 5.2 | 0.15/0.15 | 3.36% | 201 | 1000 |
| 15% polymer1 | 80 nm | 4.67 | 3.4 | 5.8 | 0.15/0.17 | 3.38% | 346 | 1000 |
| 20% polymer1 | 65 nm | 3.70 | 3.0 | 4.7 | 0.15/0.15 | 3.02% | 122 | 1000 |

Figure 7:
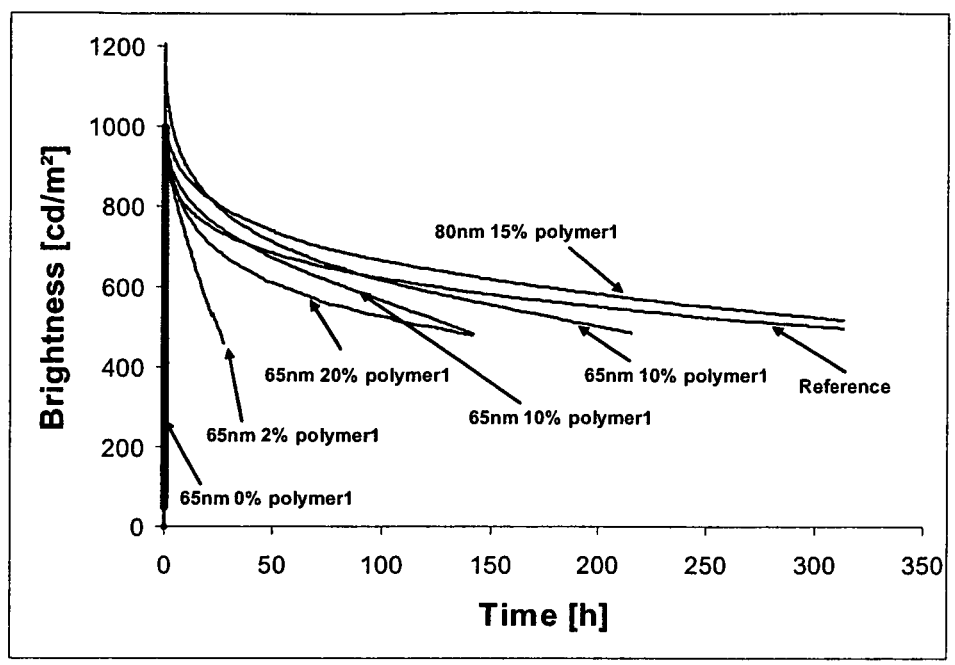
FIG. 7 depicts a comparison of the lifetime curves of the PLEDs listed in Table 5.

In FIG. 7, the lifetime curves are compared. It can be seen that all blends have much better lifetime than the pure polymer2c as emissive layer in a single layer device, which has only 14 hrs lifetime. Compared to the reference, all single layer blends PLEDs give very similar CIE coordinates. The EQE and efficiency is slightly lower than reference. Surprisingly, a PLED with a blend comprising 15 weight % of polymer1 has a lifetime that is even superior to the reference interlayer device.

Example 8

Light Emitting Diodes Using Blends of Polymer1 and Polymer2c as Emissive Layer in Interlayer Device A blend of polymer1 and polymer2c (15:85) is tested as emissive layer in a PLED device comprising an interlayer of polymer1, in comparison to a PLED interlayer device using pure polymer2c as emissive layer. The results are summarized in Table 6.

TABLE 6

| Emissive layer | Max. Eff. [cd/A] | Uon [V] | U(100) [V] | CIE @ 100 cd/m² | LT DC [hrs @ nits] | |
|---|---|---|---|---|---|---|
| 65 nm Polymer2c on IL | 5.92 | 3.4 | 5.7 | 0.15/0.17 | 304 | 1001 |
| 80 nm Blend on IL | 3.96 | 3.5 | 6.0 | 0.15/0.20 | 470 | 1000 |

Figure 8:
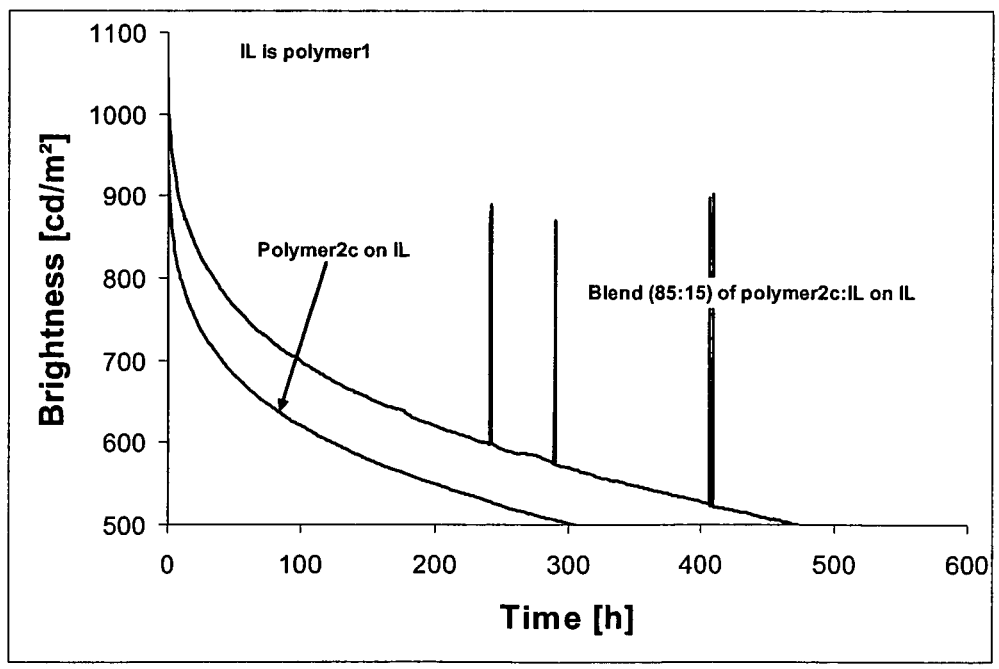
FIG. 8 depicts the lifetime improvement of an interlayer device containing a polymer blend according to the invention.

FIG. 8 clearly shows that using a polymer blend according to the invention as emissive layer in an interlayer device can still significantly improve the lifetime, in this case from 304 hrs to 470 hrs.

Example 9

Light Emitting Diodes Using Blends of Polymer1 and Polymer2d as Emissive Layer in Single Layer Device and Interlayer Device A blend of 15% wt polymer1 with 85% wt polymer2d is tested as emissive layer in a PLED device with and without an interlayer (of polymer1). The reference is a PLED device using polymer1 as interlayer and pure polymer2d in a thickness of 65 nm as emissive layer. The results are summarized in Table 7.

TABLE 7

| Emissive Layer | Thickness of LEP | Max. Eff. [cd/A] | Uon [V] | U(100) [V] | CIE @ 100 cd/m² | EQE @ Max. Eff. | LT DC [hrs @ |
|---|---|---|---|---|---|---|---|
| IL/Polymer2d | 65 nm | 17.41 | 3.2 | 4.9 | 0.31/0.59 | 5.31% | 404 5993 |
| Blend polymer1 and 2d | 80 nm | 12.96 | 3.0 | 4.8 | 0.31/0.59 | 3.96% | 365 5898 |
| IL/Blend polymer1 and 2d | 80 nm | 12.29 | 3.1 | 5.1 | 0.32/0.59 | 3.78% | 681* 5999 |

*487 hrs @ 57%, predicted as 681 hrs

Figure 9:
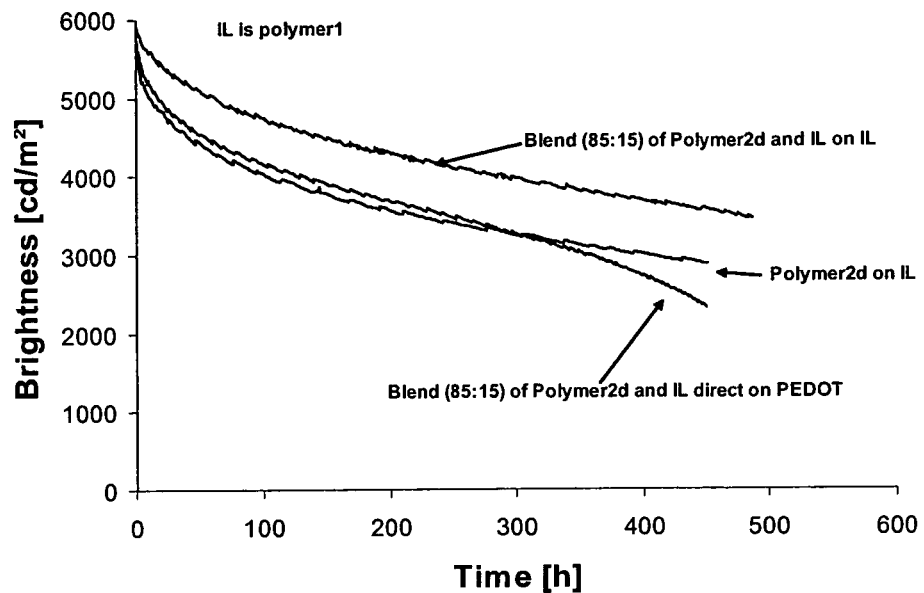
FIG. 9 depicts a comparison of the lifetime curves of the PLEDs listed in Table 7.

In FIG. 9, the lifetime curves are compared. The polymer blend shows a slightly worse performance, i.e. efficiency and lifetime, than the reference. However, if the blend is tested in an interlayer device, it gives a much longer lifetime (681 hrs) than the reference (404 hrs).

Example 10

Light Emitting Diodes Using Polymer2b and Polymer2c as Emissive Layer in Interlayer Device Pure polymer2b and polymer2c are tested as emissive layer in a PLED device with an interlayer (of polymer1). The thickness of polymer2b and polymer2c are 65 nm. The results are summarized in Table 8.

TABLE 8

| | Max. Eff. [cd/A] | Uon [V] | U(100) [V] | CIE @ 100 cd/m² | EQE @ Max. Eff. | LT DC [hrs @ nits] | |
|---|---|---|---|---|---|---|---|
| Polymer2b | 4.78 | 3.4 | 5.7 | 0.15/0.16 | 3.76% | 107 | 1000 |
| Polymer2c | 5.92 | 3.4 | 5.7 | 0.15/0.17 | 4.41% | 304 | 1001 |

Figure 10:
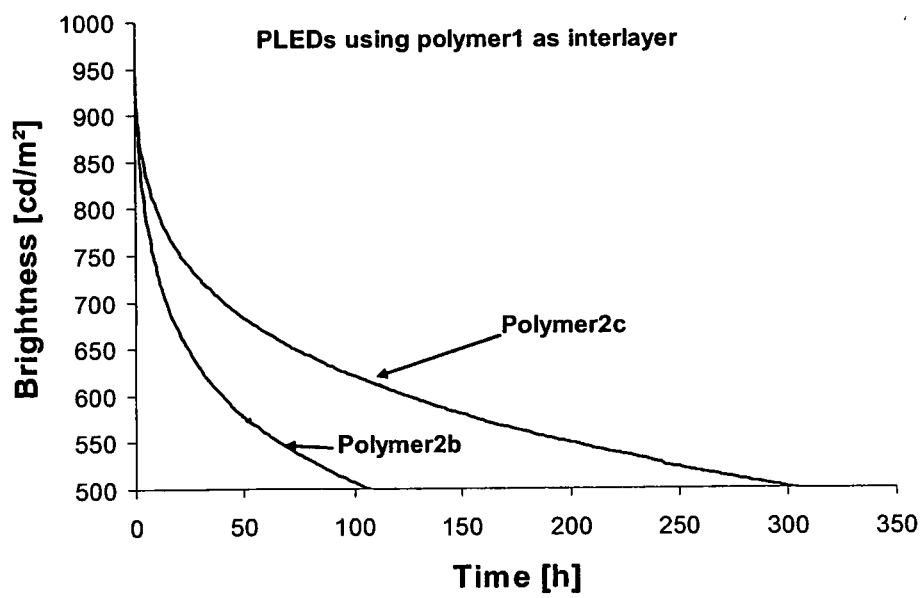
FIG. 10 depicts a comparison of the lifetime curves of the PLEDs listed in Table 8.

In FIG. 10, the lifetime curves are compared. In summary, the polymer with an emissive unit (polymer2c) shows a much better performance, especially lifetime, than the polymer only with exciton formation unit, e.g. without additional emissive unit.

The invention claimed is:

1. A polymer blend comprising
a first polymer comprising a hole transporting unit comprising a group B and a group $A^h$, wherein $A^h$ is a group having hole transport property;
a second polymer comprising an electron transporting unit comprising a group B and a group $A^e$, wherein $A^e$ is a group having electron transport property, and an exciton formation unit comprising a group B and a group $A^{ex}$, wherein $A^{ex}$ is a group having exciton formation property, and optionally comprising one or more further emissive and/or exciton formation units;
wherein the group B denotes, independently of one another, identical or different backbone groups;
wherein the first polymer comprises one or more identical or different groups of formula (II) as hole transporting groups $A^h$

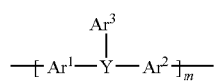

(II)

wherein
Y is N, P, P=O, $PF_2$, P=S, As, As=O, As=S, Sb, Sb=O, or Sb=S, $Ar^1$ is identically or differently, independently if in different repeat units, a single bond or an optionally substituted mononuclear or polynuclear aryl group;
$Ar^2$ is identically or differently, independently if in different repeat units, an optionally substituted mononuclear or polynuclear aryl group;
$Ar^3$ is identically or differently, independently if in different repeat units, an optionally substituted mononuclear or polynuclear aryl group, which may be optionally substituted by a bridging group linking different chain residues of formula (II); and
m is 1, 2, or 3; and
wherein the ratio of groups of formula (II) in the first polymer is from 10 to 80 mol %;

wherein the second polymer comprises one or more identical or different groups of formula (I) as electron transporting groups $A^e$

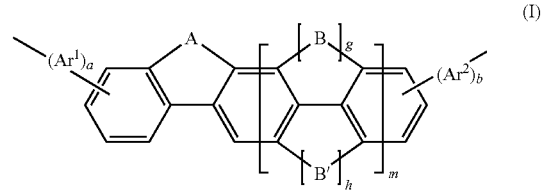

(I)

wherein
A, B, and B' are, independently of each other, and in the case of multiple occurrences, independently of one another, a divalent group selected from the group consisting of —$CR^1R^2$—, —$NR^1$—, —$PR^1$—, —O—, —S—, —SO—, —$SO_2$—, —CO—, —CS—, —CSe—, —P(=O)$R^1$—, —P(=S)$R^1$—, and —$SiR^1R^2$—;
$R^1$ and $R^2$ are, identically or differently, independently of each other, H, halogen, —CN, —NC, —NCO, —NCS, —OCN, —SCN, —C(=O)$NR^0R^{00}$, —C(=O)X, —C(=O)$R^0$, —$NH_2$, —$NR^0R^{00}$, —SH, —$SR^0$, —$SO_3H$, —$SO_2R^0$, —OH, —$NO_2$, —$CF_3$, —$SF_5$, optionally substituted silyl, or carbyl or hydrocarbyl having 1 to 40 C atoms, wherein said carbyl or hydrocarbyl are optionally substituted and optionally comprise one or more hetero atoms;
X is halogen;
$R^0$ and $R^{00}$ are, independently of each other, H or an optionally substituted carbyl or hydrocarbyl group optionally comprising one or more hetero atoms;

g and h are, independently, 0 or 1, wherein when g is 0, h is 1 and when g is 1, h is 0;

m is an integer greater than or equal to 1;

$Ar^1$ and $Ar^2$ are, independently of each other, a mono- or polynuclear aryl or heteroaryl optionally substituted;

a and b are, independently of each other, 0 or 1;

wherein the ratio of groups of formula (I) in the second polymer is from 1 to 95 mol %;

wherein the second polymer comprises one or more identical or different groups of formula (II) as exciton formation groups $A^{ex}$ $$-\!\!\!+\!\!Ar^1-\overset{\overset{Ar^3}{|}}{Y}-Ar^2\!\!+\!\!\!\!-\!\!\!-_m \quad (II)$$

wherein

Y is N, P, P=O, $PF_2$, P=S, As, As=O, As=S, Sb, Sb=O, or Sb=S, $Ar^1$ is identically or differently, independently if in different repeat units, a single bond or an optionally substituted mononuclear or polynuclear aryl group;

$Ar^2$ is identically or differently, independently if in different repeat units, an optionally substituted mononuclear or polynuclear aryl group;

$Ar^3$ is identically or differently, independently if in different repeat units, an optionally substituted mononuclear or polynuclear aryl group, which may be optionally substituted by a bridging group linking different chain residues of formula (II); and m is 1, 2, or 3; and wherein the ratio of groups of formula (II) in the second polymer is from 0.01 to 10 mol %;

with the proviso that a blend that comprises (1) a polymer comprising substituted or unsubstituted fluorene and triarylamine units and (2) a polymer comprising substituted or unsubstituted fluorene and benzothiadiazole units is excluded;

wherein each of said units has a HOMO and a LUMO;

wherein the difference between the HOMO and the LUMO of each unit constitutes an energy gap;

wherein the HOMO and LUMO of said hole transporting unit comprising groups B and $A^h$ is based on a trimer of structure -B-$A^h$-B-, the HOMO and LUMO of said electron transporting unit comprising groups B and $A^e$ is based on a trimer of structure -B-$A^e$-B-, and the HOMO and LUMO of said exciton formation unit comprising groups B and $A^{ex}$ is based on a trimer of structure -B-$A^{ex}$-B-;

wherein the HOMO of both trimers -B-$A^h$-B- and -B-$A^{ex}$-B- are at least 0.2 eV higher than the HOMO of -B-$A^e$-B-.

2. The polymer blend of claim 1, wherein the HOMO of both trimers -B-$A^h$-B- and -B-$A^{ex}$-B- are at least 0.3 eV higher than the HOMO of trimer -B-$A^e$-B-.

3. The polymer blend of claim 1, wherein the HOMO of said trimer -B-$A^{ex}$-B- is at least 0.4 eV higher than the HOMO of trimer -B-$A^e$-B-.

4. The polymer blend of claim 1, wherein said second polymer comprises at least one emissive unit.

5. The polymer blend of claim 4, wherein said second polymer contains one or more additional emissive units, wherein the excitation energy is transferred from the exciton formation unit comprising B and $A^{ex}$ to each of said additional emissive units, and the energy of each of said additional emissive units is smaller than the energy gap of said exciton formation unit.

6. The polymer blend of claim 5, wherein said additional emissive units emit blue, green, and/or red light.

7. The polymer blend of claim 1, wherein the exciton formation unit comprising B and $A^{ex}$ is itself an emissive unit.

8. The polymer blend of claim 1, wherein the ratio of said additional emissive units is from 0.01 to 10 mol %.

9. The polymer blend of claim 1, wherein the second polymer has a negligible hole mobility compared to the first polymer.

10. The polymer blend of claim 1, wherein the first polymer has a negligible electron mobility compared to the second polymer.

11. The polymer blend of claim 1, wherein the proportion of the first polymer in the blend is from 0.1 to 50 weight %.

12. The polymer blend of claim 1, wherein the first polymer comprises one or more further emissive units.

13. The polymer blend of claim 1, wherein the first-polymer comprises one or more identical or different groups of formula (I) as backbone B (I)

wherein

A, B, and B' are, independently of each other, and in the case of multiple occurrences, independently of one another, a divalent group selected from the group consisting of —$CR^1R^2$—, —$NR^1$—, —$PR^1$—, —O—, —S—, —SO—, —$SO_2$—, —CO—, —CS—, —CSe—, —P(=O)$R^1$—, —P(=S)$R^1$—, and —$SiR^1R^2$—;

$R^1$ and $R^2$ are, identically or differently, independently of each other, H, halogen, —CN, —NC, —NCO, —NCS, —OCN, —SCN, —C(=O)$NR^0R^{00}$, —C(=O)X, —C(=O)$R^0$, —$NH_2$, —$NR^0R^{00}$, —SH, —$SR^0$, —$SO_3H$, —$SO_2R^0$, —OH, —$NO_2$, —$CF_3$, —$SF_5$, optionally substituted silyl, or carbyl or hydrocarbyl having 1 to 40 C atoms, wherein said carbyl or hydrocarbyl are optionally substituted and optionally comprise one or more hetero atoms;

X is halogen;

$R^0$ and $R^{00}$ are, independently of each other, H or an optionally substituted carbyl or hydrocarbyl group optionally comprising one or more hetero atoms;

g and h are, independently, 0 or 1, wherein when g is 0, h is 1 and when g is 1, h is 0;

m is an integer greater than or equal to 1;

$Ar^1$ and $Ar^2$ are, independently of each other, a mono- or polynuclear aryl or heteroaryl optionally substituted;

a and b are, independently of each other, 0 or 1.

14. The polymer blend of claim 13, wherein the ratio of groups of formula (I) in the first polymer is from 10 to 80 mol %.

15. The polymer blend of claim 1, wherein the second polymer comprises one or more identical or different groups of formula (IV) as backbone B (IV)

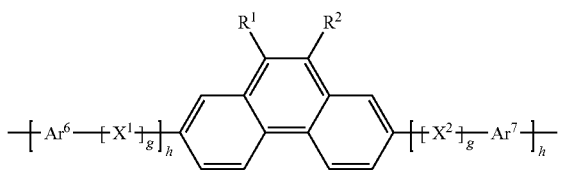

wherein
R¹ and R² are, identically or differently, independently of each other, H, halogen, —CN, —NC, —NCO, —NCS, —OCN, —SCN, —C(=O)NR⁰R⁰⁰, —C(=O)X, —C(=O)R⁰, —NH₂, —NR⁰R⁰⁰, —SH, —SR⁰, —SO₃H, —SO₂R⁰, —OH, —NO₂, —CF₃, —SF₅, optionally substituted silyl, or carbyl or hydrocarbyl having 1 to 40 C atoms, wherein said carbyl or hydrocarbyl are optionally substituted and optionally comprise one or more hetero atoms;
X is halogen;
R⁰ and R⁰⁰
are, independently of each other, H or an optionally substituted carbyl or hydrocarbyl group optionally comprising one or more hetero atoms;
X¹ and X² are, independently of each other, —CR¹=CR¹—, —C≡C—, or —N—Ar⁸—;
Ar⁶, Ar⁷, and Ar⁸
are, and in the case of multiple occurrences, independently of one another, a bivalent aromatic or heteroaromatic ring system having from 2 to 40 C atoms, which is optionally substituted by one or more groups R¹;
g is, on each occurrence, independently of one another, 0 or 1,
h is, on each occurrence, independently of one another, 0, 1, or 2.

16. The polymer blend of claim 1, wherein the second polymer comprises one or more identical or different groups of formula (VI)

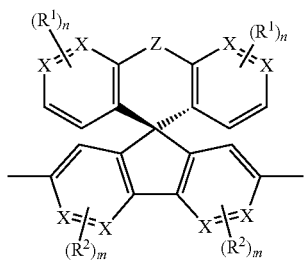

(VI)

wherein
X is, on each occurrence, independently of one another, CH, CR¹, or N;
Z is, on each occurrence, independently of one another, a single bond, CR⁵R⁶, CR⁵R⁶—CR⁵R⁶, CR⁵=CR⁶, O, S, N—R⁵, C=O, C=CR⁵R⁶, or SiR⁵R⁶;
R¹, R², R⁵ and R⁶
are, identically or differently, independently of each other, H, halogen, —CN, —NC, —NCO, —NCS, —OCN, —SCN, —C(=O)NR⁰R⁰⁰, —C(=O)X⁰, —C(=O)R⁰, —NH₂, —NR⁰R⁰⁰, —SH, —SR⁰, —SO₃H, —SO₂R⁰, —OH, —NO₂, —CF₃, —SF₅, optionally substituted silyl, or carbyl or hydrocarbyl having 1 to 40 C atoms, wherein said carbyl or hydrocarbyl are optionally substituted and optionally comprise one or more hetero atoms;
X⁰ is halogen;
R⁰ and R⁰⁰
are, independently of each other, H or an optionally substituted carbyl or hydrocarbyl group optionally comprising one or more hetero atoms;
m is, on each occurrence, independently of one another, 0, 1, 2, or 3,
n is, on each occurrence, independently of one another, 0, 1, 2, 3, or 4.

17. The polymer blend of claim 1, wherein the second polymer comprises one or more identical or different groups of formula (XV)

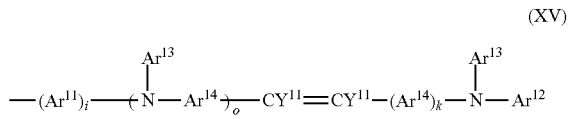

(XV)

wherein
Ar¹¹ is, on each occurrence, independently of one another, a mono- or polycyclic aryl or heteroaryl, which is optionally substituted by one or more groups R²¹,
Ar¹² is, on each occurrence, independently of one another, a mono- or polycyclic aryl or heteroaryl, which is optionally substituted by one or more groups R²²,
Ar¹³ is, on each occurrence, independently of one another, a mono- or polycyclic aryl or heteroaryl, which is optionally substituted by one or more groups R²³,
Ar¹⁴ is, on each occurrence, independently of one another, a mono- or polycyclic aryl or heteroaryl, which is optionally substituted by one or more groups R²⁴,
Y¹¹ is, and in the case of multiple occurrences, independently of one another, selected from H, F, Cl, or carbyl or hydrocarbyl with 1 to 40 C atoms, wherein said carbyl or hydrocarbyl are optionally substituted and optionally comprise one or more hetero atoms, and wherein two groups Y¹¹, or a group Y¹¹ and an adjacent group R²¹, R²⁴, Ar¹¹, or Ar¹⁴, together optionally define an aromatic, mono- or polycyclic ring system;
R²¹, R²², R²³, and R²⁴
are, and in the case of multiple occurrences, independently of one another, H, halogen, —CN, —NC, —NCO, —NCS, —OCN, —SCN, —C(=O) NR⁰R⁰⁰, —C(=O)X⁰, —C(=O)R⁰, —NH₂, —NR⁰R⁰⁰, —SH, —SR⁰, —SO₃H, —SO₂R⁰, —OH, —NO₂, —CF₃, —SF₅, optionally substituted silyl, or carbyl or hydrocarbyl with 1 to 40 C atoms, wherein said carbyl or hydrocarbyl are optionally substituted and optionally comprise one or more hetero atoms, and wherein two or more groups R²¹, R²², R²³, and R²⁴ together define an aliphatic or aromatic, mono- or polycyclic ring system; and wherein each of R²¹, R²², and R²³ optionally are, independently of one another, a covalent bond in a polymer;
X⁰ is halogen;
R⁰ and R⁰⁰
are, independently of each other, H or an optionally substituted carbyl or hydrocarbyl group optionally comprising one or more hetero atoms;
i is, on each occurrence, independently of one another 1, 2, or 3, k is, on each occurrence, independently of one another, 1, 2, or 3, o is on each occurrence, independently of one another, 0 or 1.

18. The polymer blend of claim 1, wherein the second polymer comprises one or more identical or different groups of formula (XVI)

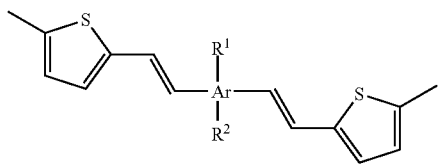

(XVI)

wherein
R¹ and R²
are, identically or differently, independently of each other, H, halogen, —CN, —NC, —NCO, —NCS, —OCN, —SCN, —C(=O)NR⁰R⁰⁰, —C(=O)X, —C(=O)R⁰, —NH₂, —NR⁰R⁰⁰, —SH, —SR⁰, —SO₃H, —SO₂R⁰, —OH, —NO₂, —CF₃, —SF₅, optionally substituted silyl, or carbyl or hydrocarbyl having 1 to 40 C atoms, wherein said carbyl or hydrocarbyl are optionally substituted and optionally comprise one or more hetero atoms, and wherein R¹ and R² optionally define a spiro group with Ar;

X is halogen;
R⁰ and R⁰⁰
are, independently of each other, H or an optionally substituted carbyl or hydrocarbyl group optionally comprising one or more hetero atoms; and
Ar is a mono- or polynuclear aryl or heteroaryl optionally substituted.

19. An electronic or electrooptical device comprising the polymer blend of claim 1.

20. The electronic or electrooptical device of claim 19, wherein said device comprises a conductive polymer layer and/or a hole transporting layer, and said polymer blend is coated directly onto said conductive polymer and/or hole transport layer.

21. The electronic or electrooptical device of claim 19, wherein said electronic or electrooptical device is a polymer light emitting diode, organic field effect transistor, thin film transistor, organic solar cell, organic laser diode, organic integrated circuit, radio frequency identification tag, photodetector, sensor, logic circuit, memory element, capacitor, charge injection layer, Schottky diode, photoconductor, electrophotographic element, or organic light emitting transistor.

22. A method for preparing the polymer blend of claim 1, comprising mixing said first polymer with said second polymer, and optionally with one or more further polymers.

23. A planarising layer, antistatic film, conducting substrate, or conducting pattern comprising the polymer blend of claim 1.

* * * * *